(12) United States Patent
Sugita et al.

(10) Patent No.: US 7,079,361 B2
(45) Date of Patent: Jul. 18, 2006

(54) MAGNETORESISTIVE ELEMENT AND MAGNETORESISTIVE MAGNETIC HEAD, MAGNETIC RECORDING APPARATUS AND MAGNETORESISTIVE MEMORY DEVICE USING THE SAME

(75) Inventors: Yasunari Sugita, Osaka (JP); Masayoshi Hiramoto, Ikoma (JP); Nozomu Matsukawa, Nara (JP); Mitsuo Satomi, Katano (JP); Yoshio Kawashima, Neyagawa (JP); Akihiro Odagawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/060,028

(22) Filed: Feb. 16, 2005

(65) Prior Publication Data
US 2005/0135020 A1 Jun. 23, 2005

Related U.S. Application Data

(63) Continuation of application No. 10/276,966, filed as application No. PCT/JP02/04062 on Apr. 24, 2002, now abandoned.

(30) Foreign Application Priority Data

Apr. 24, 2001 (JP) ............................. 2001-126657
Dec. 13, 2001 (JP) ............................. 2001-379998

(51) Int. Cl.
*G11B 5/127* (2006.01)

(52) U.S. Cl. ..................................... 360/324

(58) Field of Classification Search ............... 360/324, 360/324.2, 321, 324.12; 428/694 T, 332, 428/830; 420/82; 365/171, 173
See application file for complete search history.

(56) References Cited

U.S. PATENT DOCUMENTS

| | | | | |
|---|---|---|---|---|
| 4,098,605 A | * | 7/1978 | Nepela et al. | ............... 420/82 |
| 5,449,419 A | | 9/1995 | Suzuki et al. | |
| 5,603,766 A | | 2/1997 | Visokay et al. | |
| 5,753,131 A | | 5/1998 | Choukh et al. | |
| 5,759,681 A | * | 6/1998 | Hosoe et al. | ............... 428/332 |
| 5,801,984 A | | 9/1998 | Parkin | |

(Continued)

FOREIGN PATENT DOCUMENTS

EP 0 674 327 9/1995

(Continued)

OTHER PUBLICATIONS

Symposium on Spin Tunneling and Injection Phenomena, Johnson. M, in J. Appln. Phys. 79(8), Apr. 15, 1996, pp. 4724-4729.

(Continued)

*Primary Examiner*—Allen Cao
(74) *Attorney, Agent, or Firm*—Hamre, Schumann, Mueller & Larson, P.C.

(57) ABSTRACT

The present invention provides a magnetoresistive (MR) element that is excellent in MR ratio and thermal stability and includes at least one magnetic layer including a ferromagnetic material M-X expressed by $M_{100-a}X_a$. Here, M is at least one selected from Fe, Co and Ni, X is expressed by $X^1_b X^2_c X^3_d$ ($X^1$ is at least one selected from Cu, Ru, Rh, Pd, Ag, Os, Ir, Pt and Au, $X^2$ is at least one selected from Al, Sc, Ti, V, Cr, Mn, Ga, Ge, Y, Zr, Nb, Mo, Hf, Ta, W, Re, Zn and lanthanide series elements, and $X_3$ is at least one selected from Si, B, C, N, O, P and S), and a, b, c and d satisfy $0.05 \leq a \leq 60$, $0 \leq b \leq 60$, $0 \leq c \leq 30$, $0 \leq d \leq 20$, and $a = b+c+d$.

11 Claims, 14 Drawing Sheets

U.S. PATENT DOCUMENTS

| | | | |
|---|---|---|---|
| 6,005,753 | A | 12/1999 | Fontana et al. |
| 6,052,263 | A | 4/2000 | Gill |
| 6,057,021 | A * | 5/2000 | Ishikawa et al. ............ 428/830 |
| 6,074,743 | A * | 6/2000 | Araki et al. ................ 428/332 |
| 6,169,303 | B1 | 1/2001 | Anthony |
| 6,185,080 | B1 * | 2/2001 | Gill ......................... 360/324.2 |
| 6,201,259 | B1 | 3/2001 | Sato et al. |
| 6,210,818 | B1 | 4/2001 | Saito |
| 6,226,197 | B1 | 5/2001 | Nishimura |
| 6,312,840 | B1 | 11/2001 | Kumagai et al. |
| 6,387,548 | B1 | 5/2002 | Hasegawa et al. |
| 6,418,001 | B1 | 7/2002 | Nakatani |
| 6,473,960 | B1 | 11/2002 | Schwartz et al. |
| 6,528,326 | B1 | 3/2003 | Hiramoto et al. |
| 6,552,882 | B1 | 4/2003 | Hayashi |
| 6,583,969 | B1 | 6/2003 | Pinarbasi |
| 6,597,547 | B1 * | 7/2003 | Kawawake et al. .... 360/324.11 |
| 6,611,405 | B1 * | 8/2003 | Inomata et al. .......... 360/324.2 |
| 6,661,625 | B1 * | 12/2003 | Sin et al. ................. 360/324.2 |
| 6,724,586 | B1 * | 4/2004 | Gill ......................... 360/324.2 |
| 6,741,433 | B1 * | 5/2004 | Nishioka ................. 360/324.2 |
| 6,842,317 | B1 * | 1/2005 | Sugita et al. ............ 360/324.2 |
| 6,943,041 | B1 * | 9/2005 | Sugita et al. ................ 438/3 |
| 2001/0053053 | A1 | 12/2001 | Saito et al. |
| 2002/0015268 | A1 * | 2/2002 | Mao et al. ............. 360/324.12 |
| 2002/0039264 | A1 | 4/2002 | Ohsawa et al. |
| 2002/0047145 | A1 | 4/2002 | Nickel |
| 2002/0098381 | A1 * | 7/2002 | Coffey et al. ............ 428/694 T |
| 2002/0126422 | A1 | 9/2002 | Westwood |
| 2002/0154452 | A1 * | 10/2002 | Gill ............................. 360/321 |
| 2003/0197984 | A1 | 10/2003 | Inomata et al. |

FOREIGN PATENT DOCUMENTS

| | | |
|---|---|---|
| EP | 0 717 422 | 6/1996 |
| EP | 0 871 231 | 10/1998 |
| JP | 10-162326 | 6/1998 |
| JP | 11-266043 | 9/1999 |
| JP | 2000-020922 | 1/2000 |
| JP | 2000-067418 | 3/2000 |
| JP | 2000-068569 | 3/2000 |
| JP | 2000-132961 | 5/2000 |
| JP | 2000-187816 | 7/2000 |
| JP | 2000-188435 | 7/2000 |
| JP | 2001-236613 | 8/2001 |
| JP | 2002-171012 | 6/2002 |
| JP | 2002-204004 | 7/2002 |
| WO | 00/74154 | 12/2000 |

OTHER PUBLICATIONS

Ji Hyung Yu et al. "Magnetic Tunnel Junctions with High Magnetoresistance and Small Bias Voltage Dependence Using Expitaxial NiFe (III) Ferromagnetic Bottom Electrodes", Journal of Applied Physics, vol. 93, No. 10, pp. 8555-8557, May 15, 2003.

Koichiro Inomata, MRAM Technology Progress and Prospect Materials Integration vol. 13, No. 12, P13-18, 2000 (Japanese only), no month.

T.Miyazaki et al., "Giant Magnetic Tunneling Effect in $Fe/Al_2O_3/Fe$ Junction", Journal of Magnetism and Magnetic Materials, 139 (1995) L231-L234, no month.

Ping Shang et al., "High-resolution electron microscopy study of tunneling junctions with AlN and AlON barriers", Journal of Applied Physics, vol. 89, No. 11, pp. 6874-6876, Jun. 1, 2001.

Yasunari Sugita et al., "Tunneling Magnetoresistance Enhancement for Pt-Added Magnetic Tunnel Junctions", Japanese Journal of Applied Physics, vol. 41, No. 10A, pp. L1072-L1074, Oct. 1, 2002.

Nozomu Matsukawa et al., "Thermally stable exchange-biased magnetic tunnel junctions over 400° C" Applied Physics Letter, vol. 81, No. 25, pp. 4784-4786, Dec. 16, 2002.

* cited by examiner

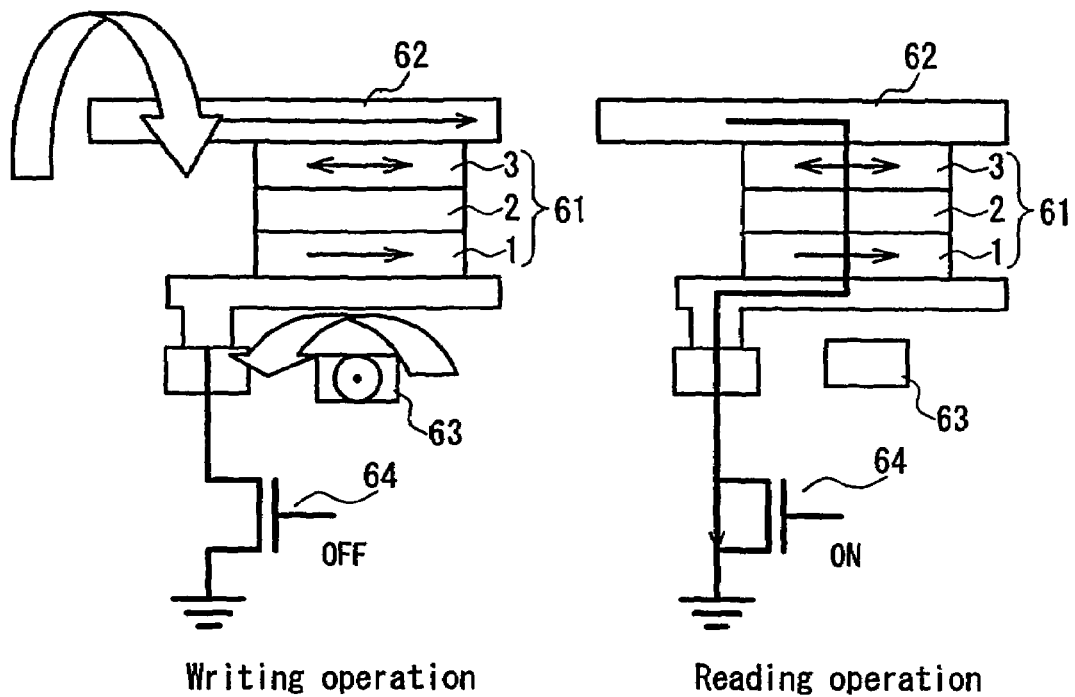
FIG. 15A  Writing operation
FIG. 15B  Reading operation
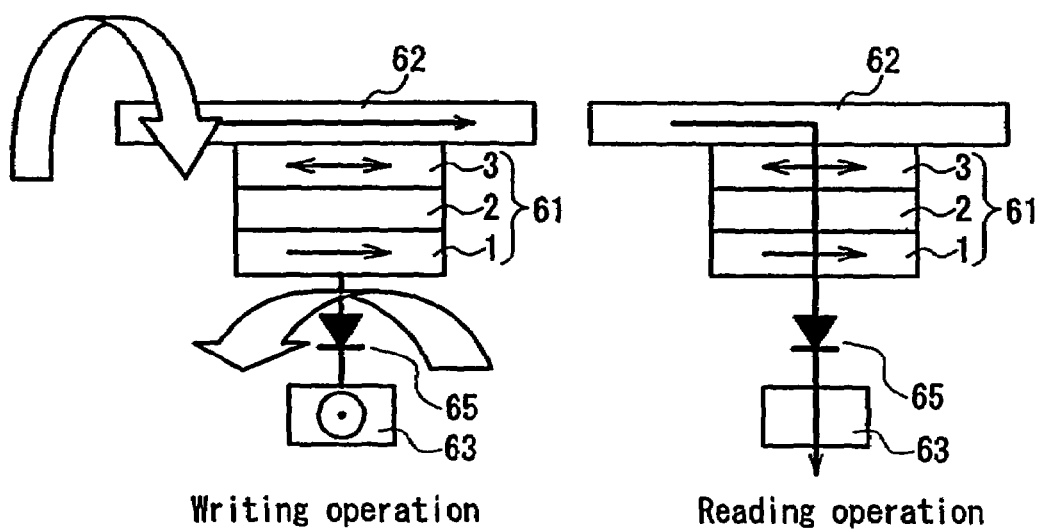
FIG. 16A  Writing operation
FIG. 16B  Reading operation

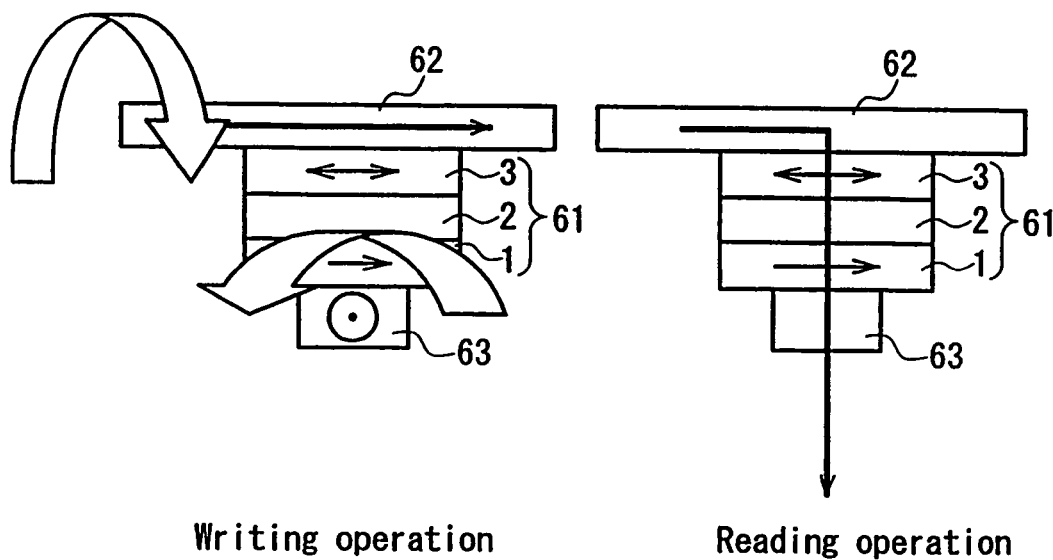
Writing operation
FIG. 17A
Reading operation
FIG. 17B
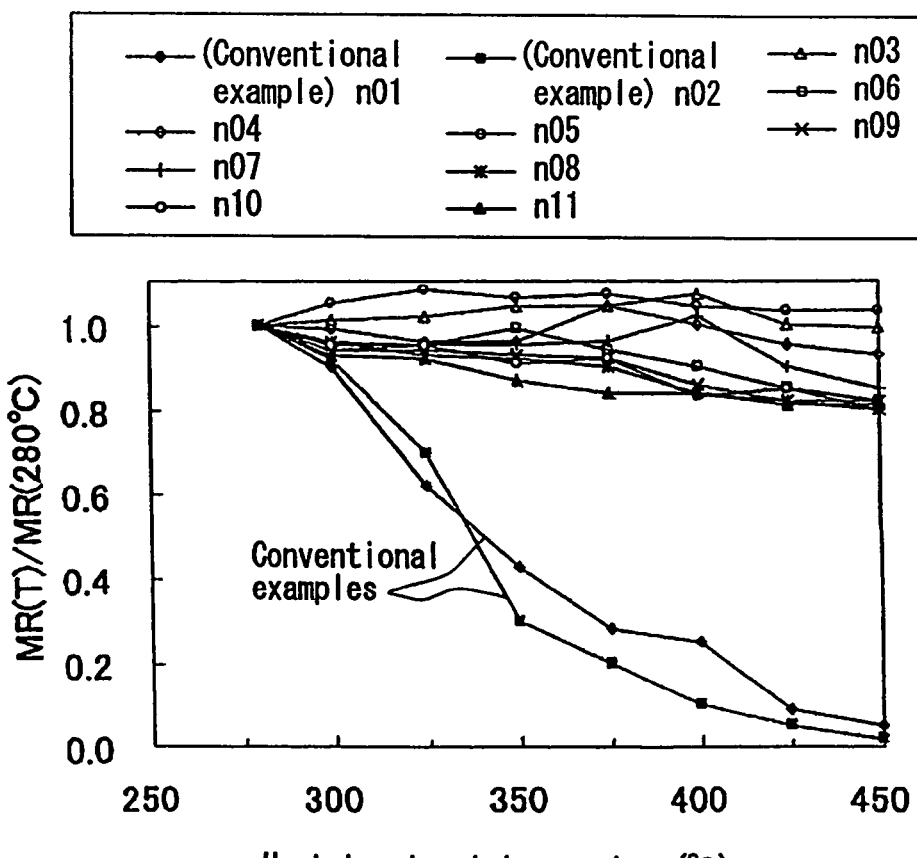
FIG. 18

MAGNETORESISTIVE ELEMENT AND MAGNETORESISTIVE MAGNETIC HEAD, MAGNETIC RECORDING APPARATUS AND MAGNETORESISTIVE MEMORY DEVICE USING THE SAME

This application is a Continuation of application Ser. No. 10/276,966, filed Feb. 19, 2003, abandoned, which is a National Stage application of PCT/JP02/04062, filed Apr. 24, 2002, which applications are incorporated herein by reference.

TECHNICAL FIELD

The present invention relates to a magnetoresistive element (abbreviated to "MR element" in the following) and magnetic devices using the same. The MR element of the present invention is particularly suitable for a magnetic recording/reproducing head for reading information from media, such as magnetic disks, magneto-optical disks and magnetic tapes, a magnetic sensor used in automobiles or the like, and a magnetoresistive memory device (i.e., a magnetic random access memory, abbreviated to "MRAM" in the following).

BACKGROUND ART

A multi-layer film in which at least two magnetic layers and at least one non-magnetic layer are stacked alternately can provide a large magnetoresistance effect, which is called a giant magnetoresistance (GMR) effect. In the multi-layer film, the non-magnetic layer is positioned between the magnetic layers i.e., magnetic layer/non-magnetic layer/magnetic layer/non-magnetic layer/ . . . ). The magnetoresistance effect is a phenomenon of electrical resistance that changes with a relative difference in magnetization direction between the magnetic layers.

A GMR element uses a conductive material such as Cu and Au for the non-magnetic layer. In general, current flows in parallel to the film surface (CIP-GMR: current in plane-GMR). On the other hand, a GMR element that allows current to flow perpendicular to the film surface is called CPP-GMR (current perpendicular to the plane-GMR). The CPP-GMR element has a larger magnetoresistance change ratio (MR ratio) and a smaller resistance compared with the CIP-GMR element.

A spin-valve type element, which is one of the GMR elements, does not require a large operating magnetic field. This element includes a free magnetic layer (a free layer) and a pinned magnetic layer (a pinned layer) that sandwich a non-magnetic layer. The spin-valve type element utilizes a change in a relative angle formed by the magnetization directions of the two magnetic layers caused by magnetization rotation of the free layer. Examples of the spin-valve type GMR element include an element that uses Fe—Mn, which is an antiferromagnetic material, for a magnetization rotation-suppressing layer and stacks this layer on an Ni—Fe/Cu/Ni—Fe multi-layer film. Though this element requires a small operating magnetic field and is excellent in linearity, the MR ratio is small. Another spin-valve type GMR element has been reported that uses a CoFe ferromagnetic material for the magnetic layer and PtMn and IrMn antiferromagnetic materials for the antiferromagnetic layer, thereby improving the MR ratio.

To achieve an even higher MR ratio, an element that uses an insulating material for the non-magnetic layer has been proposed as well. The current flowing through this element is a tunnel current, which is transmitted stochastically through an insulating layer. The element (referred to as a TMR element) is expected to have a large MR ratio as the spin polarization of the magnetic layers that sandwich the insulating layer increases. Accordingly, a magnetic metal, such as Fe, Co—Fe alloy and Ni—Fe alloy, a half-metallic ferromagnetic material, or the like is suitable for the magnetic layer.

When an MR element becomes progressively smaller with an increase in recording density of a magnetic head or MRAM device in the future, the MR element is required to have an even larger MR ratio.

To provide a large MR ratio in a device, the MR element also needs to have suppressed degradation of the characteristics by heat treatment. The manufacturing process of a magnetic head generally includes heat treatment at temperatures of about 250° C. to 300° C. For example, there have been studies on an MRAM device that is produced by forming a TMR element on CMOS. In such a CMOS process, the heat treatment at high temperatures of about 400° C. to 450° C. is inevitable. Though the reason for degradation of the MR element by heat treatment is not clarified fully at present, diffusion of atoms into the interface between a magnetic layer and a non-magnetic layer may affect the degradation.

Depending on a device to be used, care should be taken in working temperatures. When mounted on a hard disk drive (HDD), the MR element is required to have thermal stability at a temperature of about 150° C., which is the operating temperature of the HDD.

As described above, an element having a large magnetoresistance change ratio (MR ratio), particularly an MR element that can exhibit a high MR ratio even after heat treatment, is very important in practical use. However, a conventional MR element is insufficient to meet the above demand.

DISCLOSURE OF THE INVENTION

Therefore, the present invention employs a ferromagnetic material M-X that includes a magnetic element M and a non-magnetic element X. An MR element of the present invention includes a multi-layer film including at least two magnetic layers and at least one non-magnetic layer interposed between the two magnetic layers. The resistance value changes with a relative angle formed by the magnetization directions of the at least two magnetic layers. At least one of the magnetic layers includes a ferromagnetic material M-X expressed by $M_{100-a}X_a$, specifically by $M_{100-a}(X^1_b X^2_c X^3_d)_a$.

Here, $X^1$ is at least one element selected from the group consisting of Cu, Ru, Rh, Pd, Ag, Os, Ir, Pt and Au, $X^2$ is at least one element selected from the group consisting of Al, Sc, Ti, V, Cr, Mn, Ga, Ge, Y, Zr, Nb, Mo, Hf, Ta, W, Re, Zn and lanthanide series elements (elements of atomic number 57 through 71), and $X^3$ is at least one element selected from the group consisting of Si, B, C, N, O, P and S.

Also, a, b, c and d satisfy the following equations: $0.05 \leq a \leq 60$, $0 \leq b \leq 60$, $0 \leq c \leq 30$, $0 \leq d \leq 20$, and $a = b + c + d$.

All the values used to indicate the compositions in this specification are based on atom % (at %).

The MR element of the present invention can provide a large MR ratio. The reason for this is considered to be as follows: the addition of the non-magnetic element X causes a change in magnitude of a magnetic moment of a magnetic element, which leads to an increase in spin polarization. To make this effect more conspicuous, it is preferable that a is in the range of 0.05 to 50, particularly in the range of 1 to 40.

The MR element of the present invention is excellent also in thermal stability. The reason for this is not clarified fully at present, but is considered to be as follows: the addition of the non-magnetic element X reduces the effect of atomic diffusion at the interface between a magnetic layer and a non-magnetic layer and thus stabilizes the interface. The MR element of the present invention is suitable for applications of various devices because of its excellent thermal stability.

BRIEF DESCRIPTION OF DRAWINGS

FIGS. 15A and 15B show examples of writing and reading operations of a magnetic memory device of the present invention.

FIGS. 16A and 16B show another examples of writing and reading operations of a magnetic memory device of the present invention.

FIGS. 17A and 17B show yet further examples of writing and reading operations of a magnetic memory device of the present invention.

FIG. 18 shows the relationship between a heat treatment temperature and a standard MR ratio that were measured in an example.

BEST MODE FOR CARRYING OUT THE INVENTION

Figure 1:
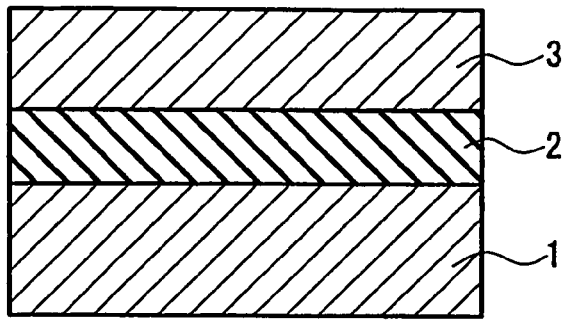
FIG. 1 is a cross-sectional view showing an example of a magnetoresistive element of the present invention.

Hereinafter, a preferred embodiment of the present invention will be described.

The non-magnetic element X should be classified into three types of $X^1$, $X^2$ and $X^3$, and used in an appropriate range that has been set according to each of the types.

The non-magnetic elements $X^1$ are the platinum group elements (Ru, Rh, Pd, Os, Ir, and Pt), each of which has more outer shell electrons (d electrons) than Fe has, and Cu, Ag and Au, each having ten d electrons. In particular, the platinum group elements are characterized by showing remarkable magnetism when added to the magnetic element M and increase the spin polarization compared with other elements. Therefore, they are advantageous in providing a higher MR ratio. Since the platinum group elements have a large atomic diameter and are stabilized chemically as well, they also are useful in achieving the device process stability in junction configuration of the MR element, i.e., higher thermal stability.

The non-magnetic elements $X^2$ are transition metal elements, each of which has fewer outer shell electrons than Fe has. Even when these elements are added to the magnetic element M, the spin polarization can be increased to improve the MR ratio.

The non-magnetic elements $X^3$ are non-metallic elements. The addition of theses elements to the magnetic element M allows the material to become microcrystalline or amorphous. When these elements are added, the MR ratio can be increased by a change in crystal structure, thus stabilizing the junction configuration.

When the ferromagnetic material M-X includes at least one of $X^1$ and $X^2$ (b+c>0), an MR element having a high MR ratio can be provided. In particular, when it includes both $X^1$ and $X^2$ (b>0, c>0), an MR element having a high MR ratio, excellent thermal stability, and controlled magnetic anisotropy can be provided. When the ferromagnetic material M-X includes at least one of $X^1$ and $X^3$ (b+d>0), an MR element having a high MR ratio can be provided. In particular, when it includes both $X^1$ and $X^3$ (b>0, d>0), an MR element having a high MR ratio and excellent thermal stability can be provided stably and with good repeatability.

The MR element of the present invention may be a spin-valve type element. The spin-valve type element includes a free layer and a pinned layer as the magnetic layers, and the magnetization of the free layer is relatively easier to rotate by an external magnetic field than the magnetization of the pinned layer. In this case, the ferromagnetic material can be included in at least one of the pinned and free layers. When the free layer includes the ferromagnetic material M-X, it is easy to improve the soft magnetic characteristics, e.g., to reduce a shift magnetic field of the free layer, and to suppress the degradation of the soft magnetic characteristics caused by heat treatment. When the pinned layer includes the ferromagnetic material M-X, the thermal stability of the MR characteristics is improved. Particularly, in a spin-valve film including an Mn-based antiferromagnetic material, the degradation of the MR ratio caused by impurity diffusion is suppressed. In a preferred embodiment of the present invention, a pinned layer including the ferromagnetic material M-X is deposited between an antiferromagnetic layer including Mn and the non-magnetic layer. This element can suppress the adverse effect of diffusion of Mn from the antiferromagnetic layer.

The ferromagnetic material M-X also can improve the soft magnetic characteristics of the free layer. Specifically, the absolute value of a shift magnetic field of the free layer can be reduced to 20 Oe or less, particularly to 10 Oe or less.

Figure 26A:
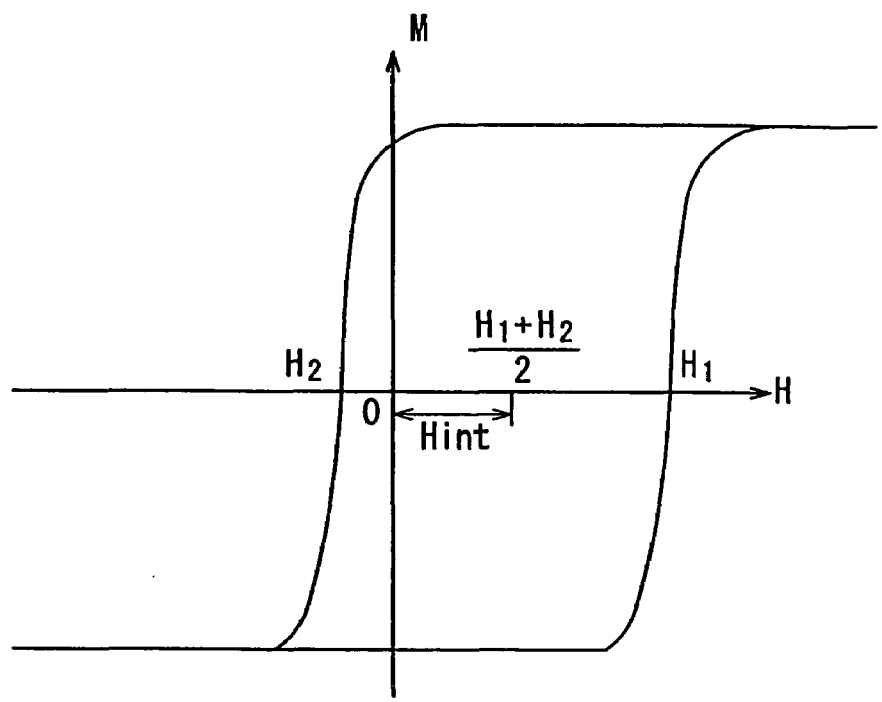
FIGS. 26A and 26B are diagrams used to explain a shift magnetic field.
Figure 26B:
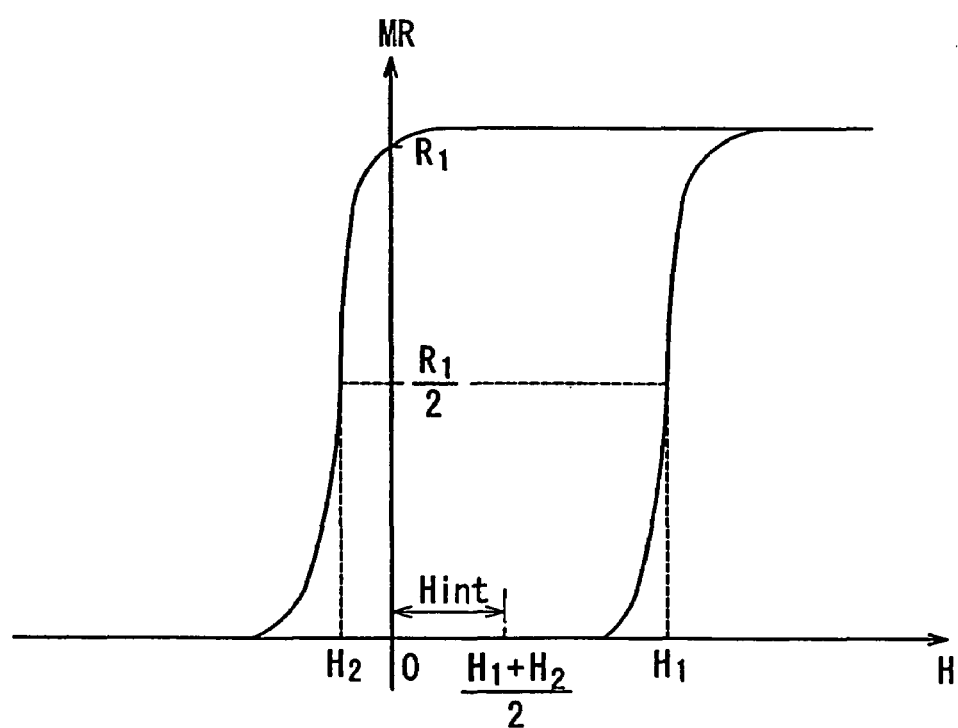

Here, a shift magnetic field is defined by $$Hint = (H_1 + H_2)/2$$

where $H_1$ and $H_2$ ($H_1 \geq H_2$) are two magnetic fields indicated by the points on a magnetization-magnetic field curve at which the magnetization is zero. The curve shows the relationship between the magnetic field and the magnetization when the magnetization of the free layer is reversed in the range of the magnetic field over which the magnetization of the pinned layer is not reversed. As shown in FIG. 26A, the shift magnetic field Hint is an index that represents the amount of shift of the magnetization-magnetic field curve (i.e., M-H curve or magnetization curve). Similarly, as shown in FIG. 26B, the shift magnetic field Hint also can be obtained from two magnetic fields $H_1$, $H_2$ indicated by the points on a magnetoresistance curve, corresponding to the M-H curve, at which the MR ratio is reduced by half. The shift magnetic field is expressed by its absolute value in the following.

The MR element of the present invention may further include an antiferromagnetic layer for suppressing the magnetization rotation of the pinned layer. The antiferromagnetic layer may include various antiferromagnetic materials.

The magnetic layer that includes the ferromagnetic material M-X may be a single-layer film or a multi-layer film. When the magnetic layer is the multi-layer film including magnetic films, at least one of the magnetic films should be made of the ferromagnetic material M-X. In particular, when the magnetic film in contact with the non-magnetic layer is made of the ferromagnetic material M-X, the thermal stability is improved greatly.

The magnetic layer may be a multi-layer film that includes a non-magnetic film and a pair of magnetic films sandwiching the non-magnetic film, and particularly a multi-layer film that includes a non-magnetic film and a pair of magnetic films that are coupled antiferromagnetically or magnetostatically via the non-magnetic film. The magnetic layer also may be a multi-layer film expressed, e.g., by M/M-X, in which the non-magnetic element X is added only to a portion of a layer made of the magnetic element M. Alternatively, the free layer may be a multi-layer film that includes a magnetic film made of M-X and a soft magnetic film formed on the magnetic film, the soft magnetic film being superior to the magnetic film in its soft magnetic characteristics. This is because the magnetization of the free layer rotates more easily. The magnetic layer may include an interface magnetic film to be formed at the interface with the non-magnetic layer or the non-magnetic film. The interface magnetic film is expected to provide a higher MR ratio. Examples of the interface magnetic film include a film that is made of $Fe_3O_4$, $CrO_2$, or the like and has a thickness of about 0.5 to 2 nm.

The MR element of the present invention can be used as both a GMR element and a TMR element. The non-magnetic layer is made of a conductive material for the GMR element and of an insulating material for the TMR element. The preferred conductive material is a material including at least one selected from the group consisting of Cu, Ag, Au, Cr and Ru. The preferred insulating material is a material including at least one selected from an oxide, a nitride and an oxynitride of Al.

When current flows perpendicular to the film surface (TMR element and CPP-GMR element), it is preferable that a pair of electrode layers are further deposited so as to sandwich the multi-layer film of magnetic layer/non-magnetic layer.

As the magnetic element M, an element expressed by $Fe_{1-p-q}Co_pNi_q$ may be used. Therefore, the above ferromagnetic material also can be expressed by a formula $[Fe_{1-p-q}Co_pNi_q]_{100-a}[X^1_bX^2_cX^3_d]_a$. Here, p and q are adjusted in the ranges of $0 \leq p \leq 1$, $0 \leq q \leq 1$, and $p+q \leq 1$.

When M is a three-component system (0<p<1, 0<q<1, p+q<1), it is preferable that p and q are in the ranges of 0<p<1 and $0<q \leq 0.9$ (more preferably, $0<q \leq 0.65$), respectively. When M is a two-component system consisting of Fe and Ni (p=0, 0<q<1; $Fe_{1-q}Ni_q$), it is preferable that q is in the range of $0<q \leq 0.95$. When M is a two-component system consisting of Fe and Co (q=0, 0<p<1; $Fe_{1-p}Co_p$), it is preferable that p is in the range of $0<p \leq 0.95$.

To achieve an even higher MR ratio without depending on the magnetic element M, it is preferable that X is at least one element selected from the group consisting of V, Cr, Mn, Ru, Rh, Pd, Re, Os, Ir and Pt.

Since Pt is an element that enables both a high MR ratio and excellent thermal stability, it is preferable to include Pt as X. When Pt is used as X, a should be in the range of 0.05 to 50. In this case, it is preferable that q is limited to the range of $0<q \leq 0.9$ for M expressed by $Fe_{1-q}Ni_q$, and that p is limited to the range of $0<p \leq 0.9$ for M expressed by $Fe_{1-p}Co_p$. M to be used with Pt may be Fe. When $Fe_{100-a}Pt_a$ is used for the pinned layer so as to provide a large reversed magnetic field, a high MR ratio, and excellent thermal stability, it is preferable that a is in the range of 0.05<a<20.

Another preferred example of X is Pd, Rh or Ir. Even when theses elements are used, a should be in the range of 0.05 to 50.

At least two elements selected from the group consisting of V, Cr, Mn, Ru, Rh, Pd, Re, Os, Ir and Pt can be used as X.

When X is expressed by $Pt_bRe_c$, it is preferable that b and c satisfy the following equations:

$$0<b<50,\ 0<c \leq 20,\ a=b+c,\ \text{and}\ 0.05 \leq a \leq 50.$$

When X is expressed by $Pt_{b1}Pd_{b2}$ or $Rh_{b1}Ir_{b2}$, it is preferable that $b_1$ and $b_2$ satisfy the following equations:

$$0<b_1<50,\ 0<b_2<50,\ a=b_1+b_2,\ \text{and}\ 0.05 \leq a \leq 50.$$

The ferromagnetic material M-X may have a composition gradient in the thickness direction. There is no particular limitation to the detail of the composition gradient. The ratio of the element M (X) may increase or decrease monotonically and vary periodically in the thickness direction.

The ferromagnetic material M-X may have a crystal structure that differs from the preferential crystal structure (the most stable crystal structure) of a material made of M at ordinary temperatures and pressures. In such a case, the spin polarization can be increased to provide a large MR ratio. It is preferable that the crystal structure of the ferromagnetic material M-X includes at least one selected from fcc (face-centered cubic lattice) and bcc (body-centered cubic lattice).

Fe tends to have the bcc structure. When the element X (e.g., Pt, Pd, Rh, Ir, Cu, Au and Ag) that tends to have the fcc structure is added to Fe, the fcc structure of, e.g., an Fe—Pt material can be obtained. When the element X (e.g., Cr, Nb, Mo, Ta, W and Eu) that tends to have the bcc structure is added to an Ni—Fe alloy having the fcc structure, the bcc structure of, e.g., an Ni—Fe—Cr material can be obtained. When Pd that tends to have the fcc structure is added to Co that tends to have an hcp structure, a Co—Pd material including the fcc structure can be obtained.

The ferromagnetic material M-X may be formed of a mixed crystal including at least two crystals. The mixed crystal may include at least two selected from the group consisting of fcc, fct (face-centered tetragonal lattice), bcc, bct (body-centered tetragonal lattice), and hcp (hexagonal close-packed lattice). The fct and the bct correspond to crystal structures in which one of the crystallographic axes of the fcc and bcc structures differs from the other two axes, respectively. The ferromagnetic material M-X also may be a mixed crystal including at least two selected from the crystal systems including a face-centered orthorhombic lattice and a body-centered orthorhombic lattice in addition to the above crystal systems. The orthorhombic lattice is an orthorhombic system in which the three axes are of different length. Alternately, the ferromagnetic material can have a structure of the phase boundary regions, e.g., between fcc and bcc and between fcc and hcp by addition of the element X.

The reason the spin polarization is increased according to a change in crystal structure is not fully clarified The relationship between the magnetic spin, the electronic structure, and the crystal structure may affect that increase, as indicated in an invar alloy.

The ferromagnetic material M-X may be amorphous, but preferably crystalline. For example, it may be columnar crystals having an average crystal grain diameter of 10 nm or less. Here, the average crystal grain diameter is evaluated in such a manner that a crystal grain in the form of a column or the like is converted to a sphere having the same volume as that of the crystal grain, and the diameter of the sphere is taken as the grain diameter.

Hereinafter, the configuration examples of an magnetoresistive element and devices (a magnetoresistive head and MRAM) using this element of the present invention will be described by referring to the drawings.

FIG. 1 is a cross-sectional view showing an example of an MR element of the present invention. In this element, two magnetic layers 1, 3 that sandwich a non-magnetic layer 2 have different magnetic fields for reversing the magnetization (i.e. coercive forces). The magnetic layer 1 with a relatively large coercive force is a pinned layer, and the magnetic layer 3 with a relatively large coercive force is a free layer. In this element, at least a portion of the magnetic layers 1, 3 should be a ferromagnetic material M-X. This element can provide a larger MR ratio and more improved thermal stability than those of a conventional MR element that uses magnetic layers made of Fe, Co, Ni, or an alloy of these elements.

The reason for an increase in MR ratio by the ferromagnetic material M-X is considered more specifically to be the following effects. A first effect is that the density of state of the magnetic element M at a Fermi surface is changed by the non-magnetic element X to increase the spin polarization in the vicinity of the Fermi surface. A second effect is that the atomic distance and the electron arrangement of magnetic atoms constituting the magnetic element M are changed by the non-magnetic element X to cause a change in band structure, thus increasing the spin polarization. A third effect is that the junction at the interface between the non-magnetic layer and the magnetic layer is improved at the atomic level due to the above material, thereby reducing diffusion that makes no contribution to magnetoresistance.

The reason for an improvement in thermal stability by the ferromagnetic material M-X is not clarified fully at present, as described above. However, the following effects of the ferromagnetic material may contribute to that improvement: atoms diffusing from the antiferromagnetic layer or the like are trapped, and a thermal stress generated at the interface between the magnetic layer and the non-magnetic layer is reduced.

In addition to the above effects, the ferromagnetic material M-X can reduce a demagnetizing field and decrease a shift magnetic field. The magnetic layer including this material has a lower saturation magnetization than that of a conventional magnetic layer made of the element M, and thus the demagnetizing field is reduced. A smaller demagnetizing field has the effect of reducing a magnetic field for reversing the magnetization (i.e., a switching magnetic field) particularly in a micro-processed element (e.g., the element area is 50 $\mu m^2$ or less, and preferably 10 $\mu m^2$ or less). A lower switching magnetic field is advantageous in reducing power consumption in devices such as MRAM.

The ferromagnetic material M-X also can reduce a so-called shift magnetic field. The shift magnetic field (Hint) is caused by a local ferromagnetic coupling (i.e., an orange-peel coupling) of magnetic poles between the magnetic layers 1, 3 that sandwich the non-magnetic layer 2, and the local ferromagnetic coupling is induced by unevenness of the interface. When the ferromagnetic material is used for the free layer or the pinned layer, the magnetic poles are weakened and the interface is smoothed compared with a conventional magnetic layer made of the element M, so that the shift magnetic field can be suppressed.

To improve the soft magnetic characteristics by reducing the demagnetizing field and suppressing the shift magnetic field, the atomic ratio a of the non-magnetic element should be in the range of 5 to 60. The atomic ratio a in the range of 15 to 60 is preferred particularly for reducing the demagnetizing field, and that in the range of 10 to 60 is advantageous in suppressing the shift magnetic field.

There is no particular limitation to the number of magnetic layers and non-magnetic layers to be stacked. For example, the non-magnetic layer and the magnetic layer can be further stacked in alternation on the configuration in FIG. 1. Even if the number of layers is increased, the effect of improving the characteristics can be obtained by using the ferromagnetic material for a portion of at least one of the magnetic layers.

The non-magnetic layer 2 may be made of a conductive or insulating material depending on the element. The conductive material to be used for the non-magnetic layer of a GMR element includes, e.g., at least one selected from the group consisting of Cu, Au, Ag, Ru, Cr, and alloys of these elements. The insulating material to be used for the non-magnetic layer (tunnel insulating layer) of a TMR element is not particularly limited as long as it is an insulator or semiconductor. However, the preferred insulating material is a compound of at least one element selected from the group consisting of Groups IIa to VIa (Groups 2 to 6 in new IUPAC system) including Mg, Ti, Zr, Hf, V, Nb, Ta and Cr, lanthanide including La and Ce, and Groups IIb to IVb (Groups 12 to 14 in new IUPAC system) including Zn, B, Al, Ga and Si, and at least one element selected from the group consisting of F, O, C, N and B. In particular, an oxide, a nitride or an oxynitride of Al is superior to other materials in the insulating characteristics, can be formed into a thin film, and also ensures excellent repeatability.

To increase a magnetic field for reversing the magnetization of the magnetic layer, an antiferromagnetic layer may be further stacked on the magnetic layer. In the element illustrated in FIG. 2, an antiferromagnetic layer 8 is provided in contact with a pinned layer 1. The pinned layer shows unidirectional anisotropy due to an exchange bias magnetic field with the antiferromagnetic layer, and thus the reversing magnetic field becomes larger. Accordingly, a clear distinction between parallel and antiparallel of the magnetization of the magnetic layer can be made to provide stable outputs.

As the antiferromagnetic layer, it is preferable to use an Mn-based antiferromagnetic material (antiferromagnetic material including Mn), such as Pt—Mn, Pd—Pt—Mn, Fe—Mn, Ir—Mn and Ni—Mn. For an underlying layer of the antiferromagnetic layer, Th, Nb, Hf, Zr, Cr, Pt, Cu, Pd or the like may be used. To enhance the crystal orientation of the antiferromagnetic layer, Ni—Fe, Ni—Fe—Cr or the like can be deposited as the underlying layer.

Figure 3:
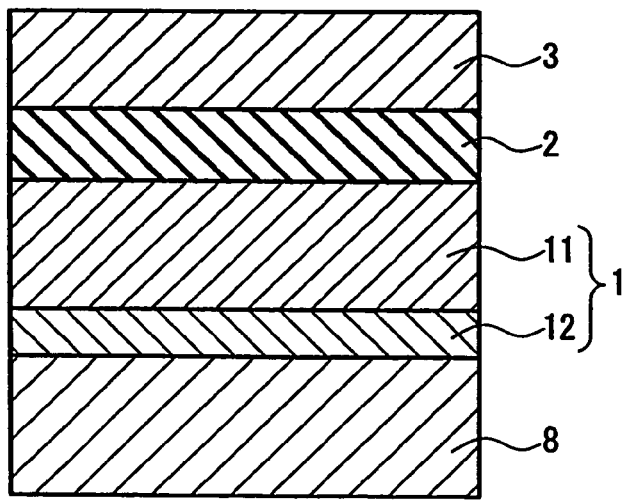
FIG. 3 is a cross-sectional view showing yet another example of a magnetoresistive element of the present invention.

As shown in FIG. 3, a pinned layer 1 may be formed as a multi-layer film, in which a first magnetic film 11 and a second magnetic film 12 are stacked in this order from the side of a non-magnetic layer 2. In this element, an exchange bias magnetic field between the second magnetic film 12 and the antiferromagnetic layer 8 and a ferromagnetic coupling between the second and first magnetic films 12, 11 impart unidirectional anisotropy to the entire pinned layer 1. When the first magnetic film 11 includes the ferromagnetic material M-X, the second magnetic film 12 is not particularly limited, and, e.g., an Fe—Co—Ni alloy can be used.

Figure 4:
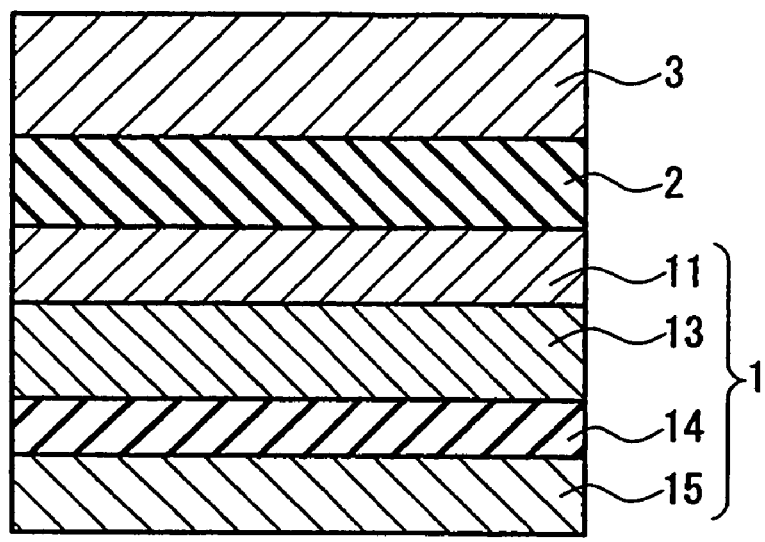
FIG. 4 is a cross-sectional view showing still another example of a magnetoresistive element of the present invention.

As shown in FIG. 4, a pinned layer 1 can be formed as a multi-layer film, in which a first magnetic film 11, a second magnetic film 13, a non-magnetic film 14, and a third magnetic film 15 are stacked in this order from the side of a non-magnetic layer 2. When the non-magnetic film 14 has an appropriate thickness, an antiferromagnetic exchange coupling is caused between the magnetic films 13 and 15. By using a hard magnetic material with large saturation magnetization, such as CoFe, for the second and third magnetic films 13, 15, a magnetic field for reversing the magnetization of the pinned layer 1 is increased. Such a multi-layer film in which the antiferromagnetic exchange coupling is established between the magnetic films via the non-magnetic film is called a laminated ferrimagnetic material. It is preferable that the non-magnetic film 14 in the laminated ferrimagnetic material is at least one selected from the group consisting of Cr, Cu, Ag, Au, Ru, Ir, Re, Os, and alloys and oxides of these elements. The preferred thickness of the non-magnetic film 14 is 0.2 to 1.2 nm.

As described above, the multi-layer film, in which at least two magnetic films are stacked with at least one non-magnetic film therebetween and the magnetization directions of the opposing magnetic films via the non-magnetic film are anti-parallel in a zero magnetic field, can reduce the demagnetizing field for a micro-processed element, thus making the response property better.

A high coercive magnetic film can be used instead of the multi-layer film (a laminated ferrimagnetic material) 13, 14, 15 illustrated in FIG. 4. As the high coercive magnetic film, it is preferable to use a material having a coercive force of 100 Oe or more (approximately at least 7.96 kA/m), such as Co—Pt, Co—Cr—Pt, Co—Ta—Pt, Co—Sm, and Fe—Tb.

Figure 5:
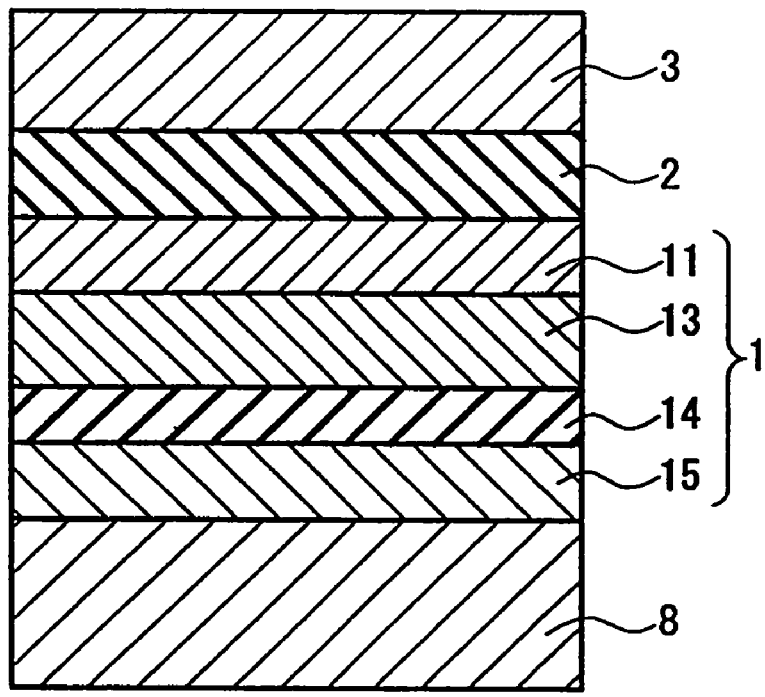
FIG. 5 is a cross-sectional view showing yet another example of a magnetoresistive element of the present invention.

In a spin-valve type element including the laminated ferrimagnetic pinned layer illustrated in FIG. 5, an antiferromagnetic layer 8 is stacked on the pinned layer 1 in FIG. 4. This element can provide a higher bias magnetic field than that of an element including the antiferromagnetic layer alone.

The magnetic films 13, 15 may be coupled magnetostatically, not antiferromagnetically. For the magnetostatic coupling, the non-magnetic film 14 is not particularly limited as long as it is a non-magnetic material. In general, however, the non-magnetic film 14 should have a thickness of 2 nm or more (and preferably 3 nm or less).

Figure 6:
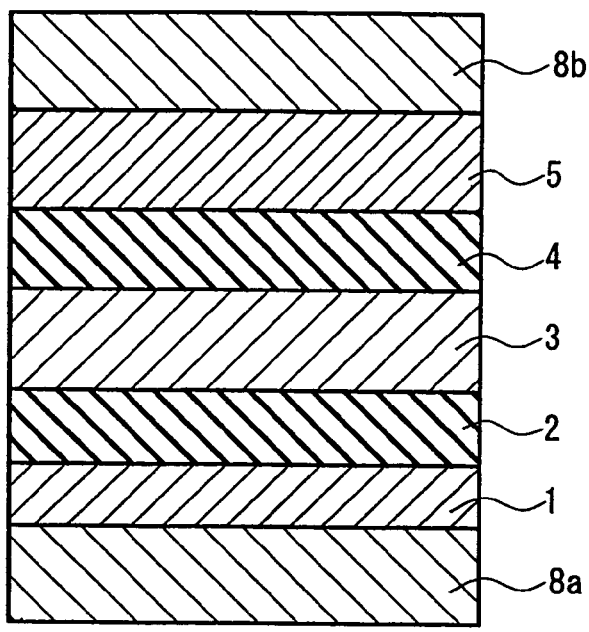
FIG. 6 is a cross-sectional view showing an example of a magnetoresistive element of the present invention that differs from the above.
Figure 7:
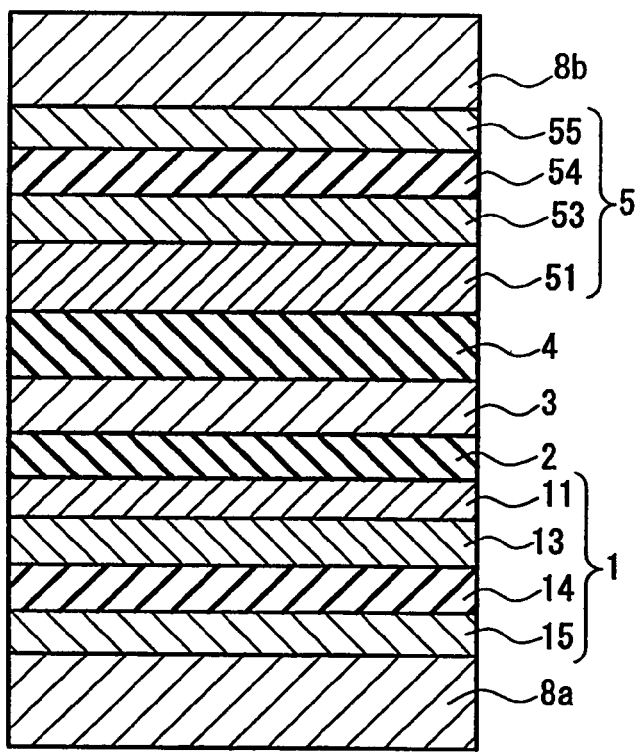
FIG. 7 is a cross-sectional view showing an example of a magnetoresistive element of the present invention that includes a plurality of pinned layers.

Elements illustrated in FIGS. 6 and 7 have a dual spin-valve structure in which pinned layers 1, 5 are positioned on both sides of a free layer 3. The element in FIG. 6 uses antiferromagnetic layers 8a, 8b so as to fix the magnetization directions of the pinned layers 1, 5. In the element in FIG. 7, each of the pinned layers 1, 5 includes a laminated ferrimagnetic pinned layer 13(53), 14(54), 15(55) on the side of the antiferromagnetic layer. When a GMR element that includes the non-magnetic layers 2, 4 made of a conductive material has the dual spin-valve structure, the interface between the magnetic layer and the non-magnetic layer at which electrons are subjected to magnetic scattering is increased, so that a larger MR ratio can be obtained. When a TMR element that includes the non-magnetic layers 2, 4 formed of tunnel insulating layers has the dual spin-valve structure, the MR ratio is not so much changed, but the bias voltage dependence of the MR properties is improved because of the two barriers.

Figure 8:
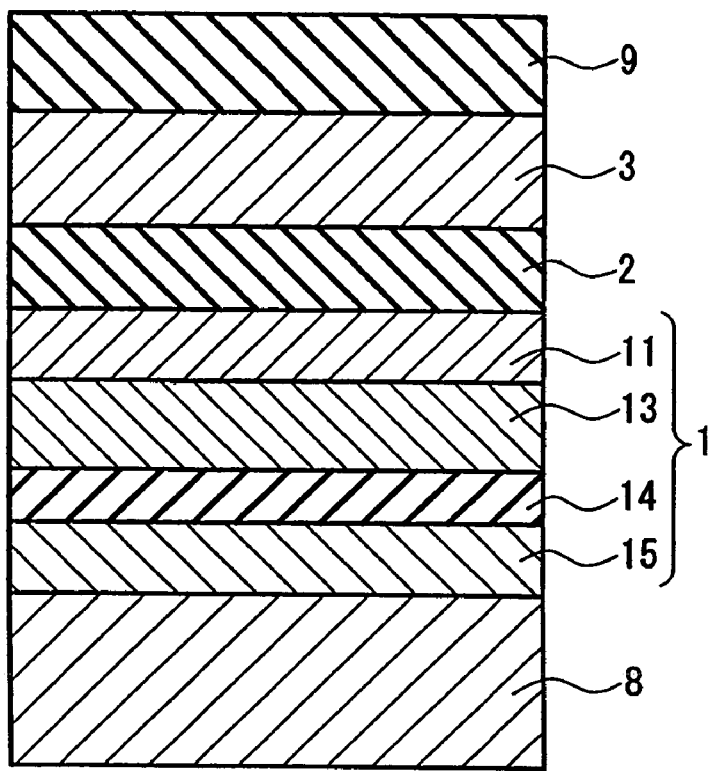
FIG. 8 is a cross-sectional view showing another example of a magnetoresistive element of the present invention that includes a plurality of pinned layers.

As shown in FIG. 8, a non-magnetic layer 9 made of an insulating material may be further stacked on a free layer 3. In a CIP-GMR element that includes the non-magnetic layer 9, electrons are reflected from the non-magnetic layer, so that the MR ratio can be improved. In a CPP-GMR element or TMR element that includes the non-magnetic layer 9, electrons having a higher energy than the Fermi level are included in those flowing through the element, so that output can be increased to improve the bias voltage dependence. Examples of the non-magnetic layer 9 include an Al oxide, Al nitride, Al oxynitride, Mg oxide, Si oxide, and Ta oxide.

Figure 9:
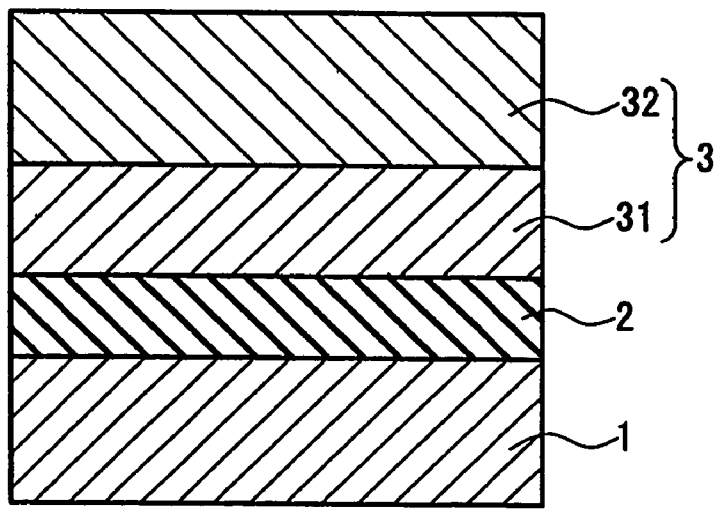
FIG. 9 is a cross-sectional view showing an example of a magnetoresistive element of the present invention in which a non-magnetic layer further is stacked.

As shown in FIG. 9, a free layer 3 may be formed as a multi-layer film. In this case, a magnetic film 31 made of the ferromagnetic material M-X should be positioned on the side of a non-magnetic layer 2. When a soft magnetic film 32 is stacked on the magnetic film 31, a magnetic field for reversing the magnetization of the free layer can be reduced. As the soft magnetic film 32, e.g., an Ni—Co—Fe alloy can be used. Expressing the composition of this alloy as $Ni_sCo_fFe_u$, an Ni-rich soft magnetic film with $0.6 \leq s \leq 0.9$, $0 \leq t \leq 0.4$, and $0 \leq u \leq 0.3$ or a Co-rich soft magnetic film with $0 \leq s \leq 0.4$, $0.2 \leq t \leq 0.95$, and $0 \leq u \leq 0.5$ is suitable.

A laminated ferrimagnetic free layer including a soft magnetic material with small saturation magnetization, such as NiFe, can be used as a portion of the free layer. The dual spin-valve type elements illustrated in FIGS. 6 and 7 also may include the laminated ferrimagnetic free layer in the free layer 3. For example, the free layer 3 may be divided into two layers, and the laminated ferrimagnetic free layer of magnetic film A/non-magnetic film B/magnetic film C/non-magnetic film D/magnetic film E may be interposed between the two layers. The configuration of the laminated ferrimagnetic free layer is not limited to the above. For example, when the antiferromagnetic exchange coupling is established between the magnetic film C and each of the divided free layers, the magnetic films A and E can be omitted.

In the MR elements described above, the MR characteristics can be improved by including the ferromagnetic material M-X in at least a portion of the magnetic layers 1, 3, 5. When a magnetic layer is further stacked, the portion of the magnetic layer that includes no M-X may be formed, e.g., of at least one metal selected from the group consisting of Fe, Co and Ni, as is the case with the conventional technique.

As the method for forming each of the thin films constituting an MR element, various sputtering methods, MBE, and ion plating can be used. The sputtering methods include pulse laser deposition (PLD), ion beam deposition (IBD), duster ion beam, RF, DC, ECR, helicon, inductively coupled plasma (ICP), and opposed targets. Instead of these PVD methods, CVD, plating, a sol-gel process, or the like can be used. The method for producing the ferromagnetic material M-X will be described below by taking sputtering as an example. This material can be produced, e.g., by depositing pellets of the non-magnetic material X on an alloy target whose composition has been determined by considering the deviation from a desired composition of the magnetic element M. The target of the magnetic element M and that of the non-magnetic element X may be sputtered simultaneously or alternately. Also, reactive sputtering can be performed by introducing a portion of the non-magnetic element X in the gas state into an apparatus. The ferromagnetic material M-X may be produced by using an alloy target whose composition has been determined by considering the deviation from a desired composition that depends on the film forming conditions (e.g., sputtering, gas species, gas pressure, and input power).

To produce a tunnel layer as the non-magnetic layer, e.g., a thin film precursor of an alloy or compound that includes at least one element selected from the group consisting of Groups IIa to VIa including Mg, Ti, Zr, Hf, V, Nb, Ta and Cr, lanthanide including La and Ce, and Groups IIb to IVb including Zn, B, Al, Ga and Si may be prepared, and then this precursor may be reacted (e.g., oxidized, nitrided, or the like) in an atmosphere containing at least one element selected from the group consisting of F, O, C, N and B as molecules, ions, or radicals with the at least one element while controlling temperature and time. As the thin film precursor, a non-stoichiometric compound that includes any one of the elements selected from F, O, C, N and B in an amount less than that defined by the stoichiometric ratio may be prepared, and then this compound may be maintained in an appropriate atmosphere containing molecules, ions, or radicals of the element included in the compound while controlling temperature and time properly so as to cause a further reaction of the element.

For example, when an $Al_2O_3$ film is produced as the tunnel insulating layer by sputtering, it is preferable to repeat the steps of forming an Al or $AlO_x$ ($X \leq 1.5$) film in an Ar or $Ar+O_2$ atmosphere and oxidizing this film in $O_2$ or $O_2$+inert gas. ECR discharge, glow discharge, RF discharge, helicon, ICP or the like can be used in making plasma or radicals.

To produce a device including an MR element that allows current to flow perpendicular to the film surface, microprocessing can be performed by combining photolithography techniques that use, e.g., physical or chemical etching, such as ion milling, RIE and FIB, a stepper for forming fine patterns, and an EB method. In the element illustrated in FIG. 10, a lower electrode 22, an MR element 23, and an upper electrode 24 are stacked in this order on a substrate 21, and an interlayer insulating film 25 is provided around the element between the electrodes. This element allows current to flow through the MR element 23 interposed between the upper and lower electrodes 24, 22 so as to read a voltage. Thus, it is preferable that the MR element causing current to flow in a direction perpendicular to the film surface further includes a pair of electrodes that sandwich the element in this direction. To flatten the surface of the electrode or the like in the element, CMP or cluster ion beam etching may be used.

As the material of the electrodes 22, 24, it is preferable to use a metal having low resistance such as Pt, Au, Cu, Ru, and Al. As the interlayer insulating film 25, it is preferable to use a material having an excellent insulating property such as $Al_2O_3$, and $SiO_2$.

Figure 11:
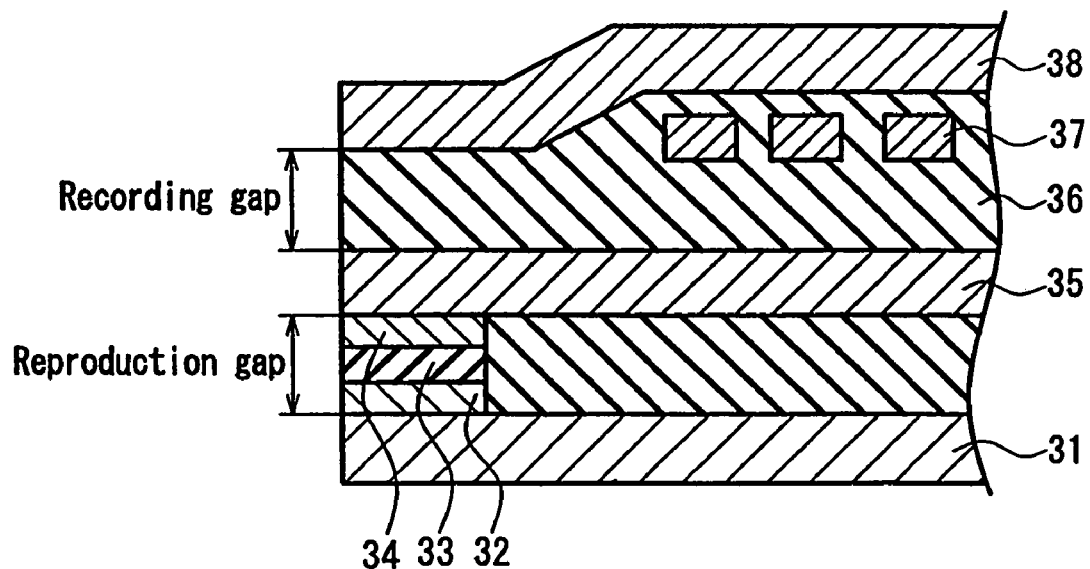
FIG. 11 shows an example of a shield-type magnetoresistive magnetic head of the present invention.

FIG. 11 shows an example of a magnetoresistive magnetic head using an MR element of the present invention. The magnetoresistive magnetic head includes two magnetic shields (i.e., an upper shield 35 and a lower shield 31) that are made of a magnetic material and suppress a magnetic field other than that to be detected from penetrating into the MR element. An MR element portion 33 and electrodes 32, 34 sandwiching the element are arranged in a reproduction gap length of the two magnetic shields. Recording of magnetic information with this head is performed in the following manner: current flows through winding portions 37, and thus a leakage field from a recording gap between a recording magnetic pole 38 and the upper shield 35 is used to write a signal into a recording medium. An insulating film 36 is formed in the portion of the recording gap and has a thickness that corresponds to the gap length. Reproduction is performed by reading a signal magnetic field from the recording medium with the MR element provided in the reproduction gap (shield gap).

When a TMR element or CPPGMR element is used for the MR element portion 33 of this magnetic head, the electrodes can be eliminated by allowing the upper and lower shields to serve as the upper and lower electrodes, so that the reproducing head has a narrower gap. For a CIP-GMR element, the upper and lower electrodes are insulated from the upper and lower shields, respectively.

Figure 12:
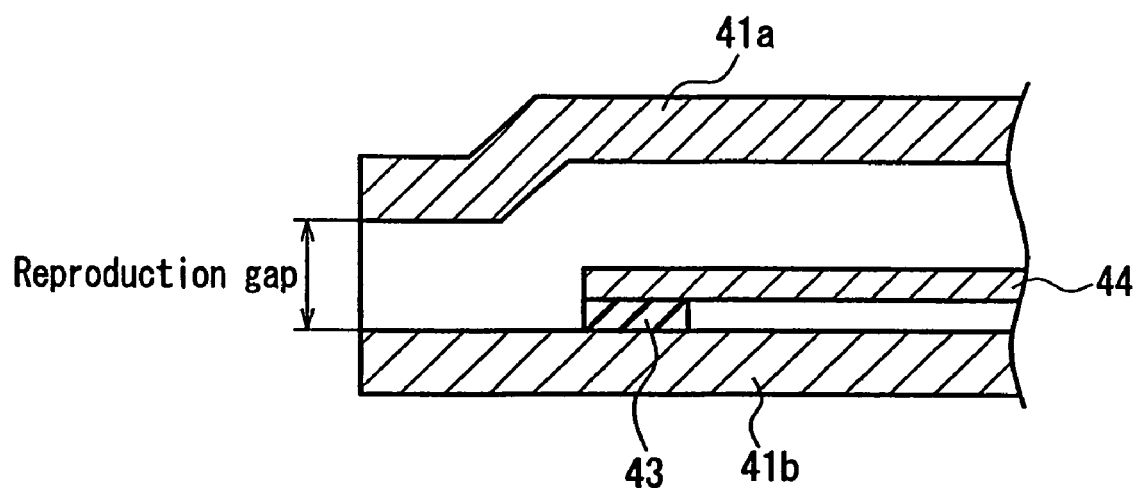
FIG. 12 shows an example of a yoke-type magnetoresistive magnetic head of the present invention.

As shown in FIG. 12, an MR element of the present invention may be used in a magnetic head having a magnetic flux guide (yoke) made of a magnetic material. In this magnetoresistive magnetic head, yokes 41a, 41b introduce a magnetic field to be detected into an MR element portion 43. The yokes serve as magnetic shields, and the lower yoke 41b under the MR element 43 also serves as a lower lead. The current for detecting a signal magnetic field flows between the upper lead 44 and the lower yoke (lower lead) 41b. The entire free layer of the MR element or a portion of the free layer also can be used as the yoke. This magnetic head is supposed to use a TMR element or CPP-GMR element. However, it also can include a CIP-GMR element that allows current to flow in parallel to the film surface by providing insulation or the like between the MR element and the yoke portion.

Figure 13:
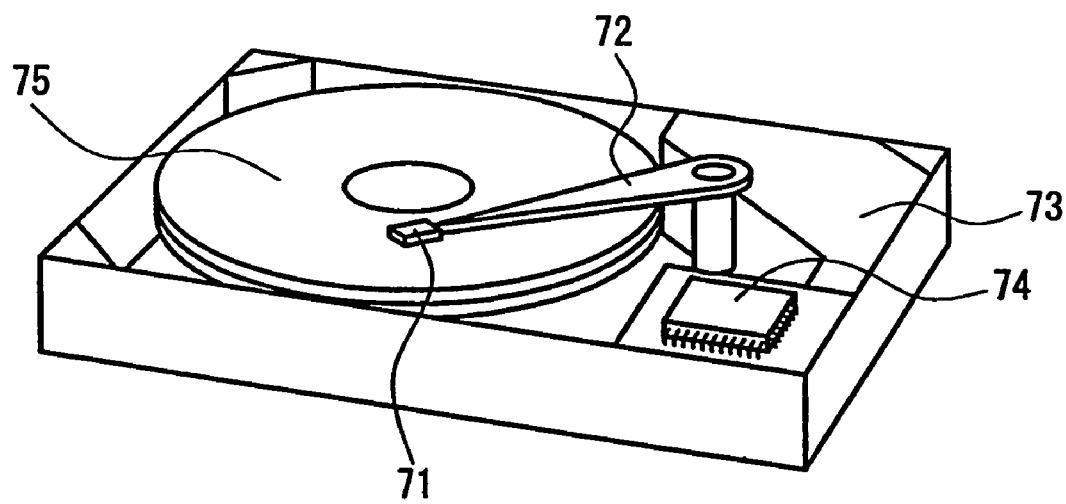
FIG. 13 shows an example of a magnetic recording apparatus of the present invention.

These magnetic heads can be used in a magnetic recording apparatus such as an HDD. As shown in FIG. 13, e.g., the HDD includes a magnetic head 71, an arm 72 for supporting the magnetic head, a driving portion 73 for the arm and a disk, a signal processing portion 74, and a magnetic recording medium (magnetic disk) 75 on which a signal is recorded/reproduced with the magnetic head.

Figure 14:
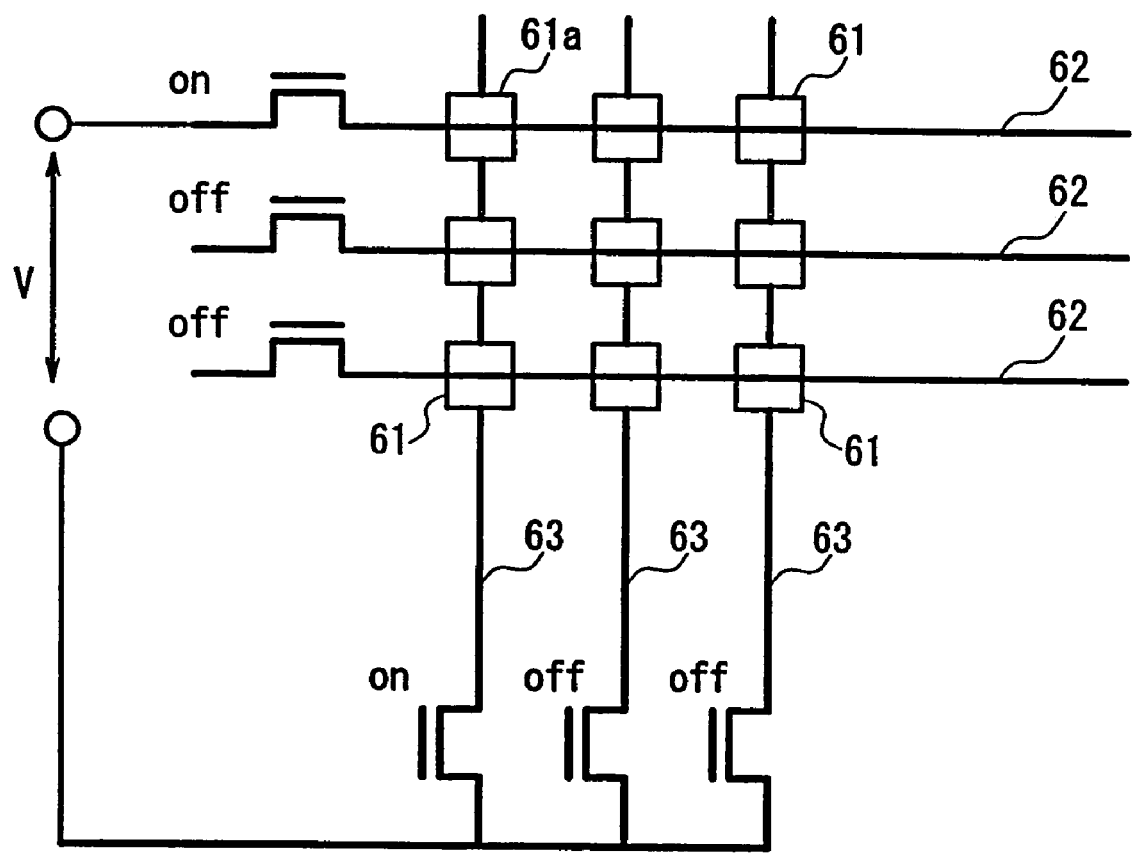
FIG. 14 shows an example of a magnetic memory device of the present invention.

FIG. 14 shows an example of an MRAM using an MR element of the present invention as a memory device. MR elements 61 are arranged at each intersection of bit (sense) lines 62 and word lines 63 in the form of a matrix. The bit and word lines may be made of Cu, Al or the like. The bit line corresponds to a conductor line for reading information, while the word line corresponds to a conductor line for recording information. A synthetic magnetic field that is generated when a signal current flows through the bit and word lines allows a signal to be recorded on the element. The signal is recorded on the element (i.e., the element 61a in FIG. 14) located at the position where the lines in the on state cross (coincident-current selection).

The operations of the MRAM will be described in more detail by referring to FIGS. 15 to 17. These drawings show examples of writing and reading operations. Here, the MR element 61 (including a pinned layer 1, a non-magnetic layer 2, and a free layer 3) illustrated in FIG. 1 is used. However, the element to be used is not limited thereto. In the MRAM shown in FIGS. 15A and 15B, a switching element 64 such as FET is provided for each element so as to read the magnetized state of the element individually. This MRAM is suitable for forming on a CMOS substrate. In the MRAM shown in FIGS. 16A and 16B, a nonlinear or rectifier element 65 is provided for each element. As the nonlinear element, e.g., a varistor, a tunnel element, or the above three-terminal element may be used. This MRAM can be formed also on an inexpensive glass substrate only by increasing the film forming process for a diode or the like. In the MRAM shown in FIGS. 17A and 17B, the element 61 is located at the intersection of the word and bit lines without using the switching element, the rectifier element, or the like. This MRAM allows current to flow through a plurality of elements for reading. Therefore, it is preferable that the number of elements should be limited to 10,000 or less so as to ensure the reading accuracy.

In FIGS. 15 to 17, the bit line 62 is used also as the sense line for reading a resistance change caused when current flows through the element. However, the sense line and the bit line may be arranged separately to prevent malfunction or destruction of the element due to a bit current. In this case, it is preferable that the bit line is insulated electrically from the element and arranged in parallel to the sense line. In view of reducing power consumption for writing, the space between the word line or the bit line and the memory cell (element) may be about 500 nm or less.

EXAMPLES

Using multi-target magnetron sputtering, an element having the configuration described in each of the following examples was formed on an Si substrate (3 inch φ) provided with a thermal oxide film, and the MR characteristics were examined.

Example 1

Si substrate with a thermal oxide film/Ta(3)/Cu(50)/Ta(3)/Pt—Mn(20)/Co—Fe(1)/ferromagnetic material M-X(2)/Al—O(1.0)/Co—Fe(3)/Ta(15)

Here, the figures in parentheses denote the film thickness (in nm; the film thickness is expressed in the same manner in the following). The thickness of the Al—O film is a designed thickness (i.e., total thickness) of Al before oxidation (this is the same in the following, including nitridation and oxynitridation for Al—N and Al—N—O). The Al—O was prepared by forming an Al film having a thickness of 0.3 to 0.7 nm and oxidizing the Al film repeatedly in an atmosphere containing oxygen (200 Torr (about 0.267 MPa), 1 min).

Figure 10:
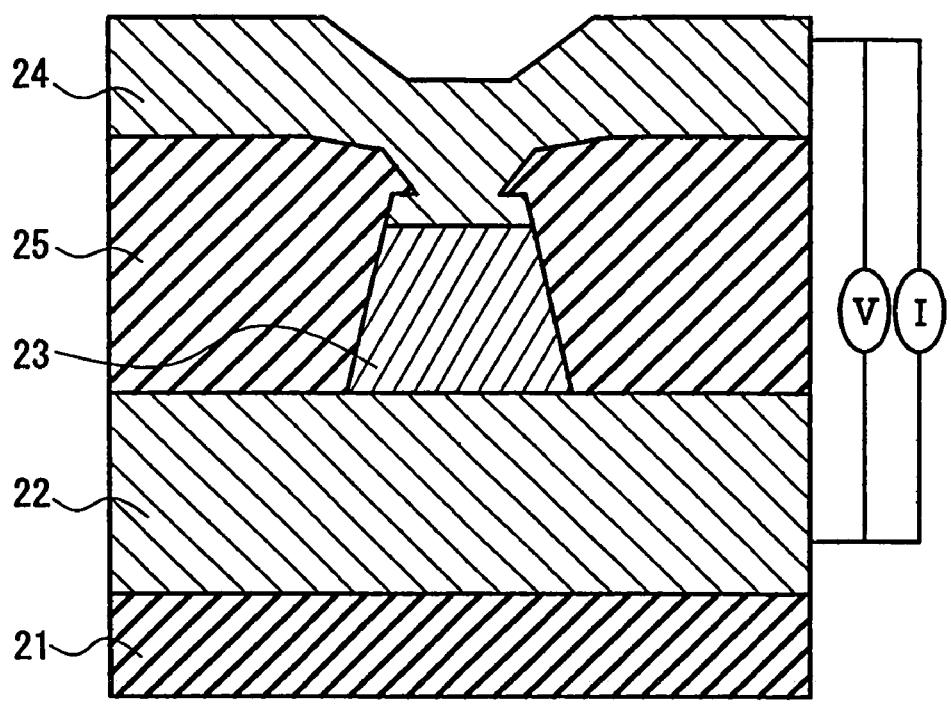
FIG. 10 is a cross-sectional view showing an example of a magnetoresistive element of the present invention in which an electrode further is provided.

The Ta(3)/Cu(50) on the substrate is a lower electrode, and the Ta(3) adjacent to the Pt—Mn is an underlying layer. The Ta(15) is a protective layer of the MR film, and a portion of the Ta(15) also acts as an upper electrode. The Pt—Mn corresponds to an antiferromagnetic layer. Each film was micro-processed in mesa fashion, as shown in FIG. 10, and Cu(50)/Ta(3) was formed as the upper electrode. Subsequently, the element was heat-treated at 280° C. for 3 hours in a magnetic field of 5 kOe so as to impart unidirectional anisotropy to the PtMn. The element area of a sample was 1.5 μm×2.5 μm.

This MR element is a spin-valve type TMR element having the configuration in accordance with FIG. 3, and a ferromagnetic material M-X is used for a portion of the pinned layer 1. The MR characteristics were examined with a direct-current four-terminal method by applying a maximum magnetic field of 5 kOe to the MR element. The MR ratio was determined by $$MR\ \text{ratio} = \{(R_{max} - R_{min})/R_{min}\} \times 100(\%)$$

where $R_{max}$ is a maximum resistance and $R_{min}$ is a minimum resistance (this is the same in the following).

The MR ratio changes according to the materials, manufacturing method and thickness of a tunnel insulating layer. It also is affected by the materials of films constituting an element, the thicknesses of the films, and processing of the element. Therefore, the characteristics of the MR element are evaluated on the basis of the characteristics of a conventional element, which is produced in the same manner as the MR element except for the use of a material that includes only the magnetic element M of the ferromagnetic material M-X. This is the same in the following examples. Table 1 shows the result of measurement.

TABLE 1

| Sample No. | Ferromagnetic material M-X | MR(%) |
|---|---|---|
| (Conventional example) a01 | $[Fe]_{100}$ | 34 |
| (Comparative example) a02 | $[Fe]_{99.96}Pt_{0.04}$ | 34 |
| a03 | $[Fe]_{99.95}Pt_{0.05}$ | 40 |
| a04 | $[Fe]_{95}Pt_5$ | 58 |
| a05 | $[Fe]_{90}Pt_{10}$ | 56 |
| a06 | $[Fe]_{80}Pt_{20}$ | 55 |
| a07 | $[Fe]_{70}Pt_{30}$ | 57 |
| a08 | $[Fe]_{50}Pt_{50}$ | 40 |
| *a09 | $[Fe]_{40}Pt_{60}$ | 34 |
| (Comparative example) a10 | $[Fe]_{35}Pt_{65}$ | 22 |
| a11 | $[Fe]_{99.95}Pd_{0.05}$ | 40 |
| a12 | $[Fe]_{90}Pd_{10}$ | 48 |
| a13 | $[Fe]_{85}Pd_{15}$ | 55 |
| a14 | $[Fe]_{65}Pd_{35}$ | 54 |
| a15 | $[Fe]_{55}Pd_{45}$ | 46 |
| *a16 | $[Fe]_{48}Pd_{52}$ | 35 |
| (Comparative example) a17 | $[Fe]_{39}Pd_{61}$ | 20 |
| a18 | $[Fe]_{90}Rh_{10}$ | 46 |
| a19 | $[Fe]_{75}Rh_{25}$ | 48 |
| a20 | $[Fe]_{60}Rh_{40}$ | 44 |
| *a21 | $[Fe]_{48}Rh_{52}$ | 35 |
| (Comparative example) a22 | $[Fe]_{37}Rh_{63}$ | 22 |
| a23 | $[Fe]_{98}Ir_2$ | 40 |
| a24 | $[Fe]_{92}Ir_8$ | 44 |
| a25 | $[Fe]_{85}Ir_{15}$ | 41 |
| a26 | $[Fe]_{70}Ir_{30}$ | 39 |

TABLE 1-continued

| Sample No. | Ferromagnetic material M-X | MR(%) |
|---|---|---|
| a27 | $[Fe]_{60}Ir_{40}$ | 37 |
| *a28 | $[Fe]_{49}Ir_{51}$ | 35 |
| (Comparative example) a29 | $[Fe]_{37}Ir_{63}$ | 11 |
| (Comparative example) a30 | $[Fe]_{99.97}Re_{0.03}$ | 34 |
| a31 | $[Fe]_{98}Re_2$ | 39 |
| a32 | $[Fe]_{95}Re_5$ | 40 |
| a33 | $[Fe]_{90}Re_{10}$ | 40 |
| a34 | $[Fe]_{80}Re_{20}$ | 38 |
| a35 | $[Fe]_{70}Re_{30}$ | 35 |
| (Comparative example) a36 | $[Fe]_{65}Re_{35}$ | 18 |
| (Comparative example) a37 | $[Fe]_{99.96}N_{0.04}$ | 34 |
| a38 | $[Fe]_{98}N_2$ | 36 |
| a39 | $[Fe]_{95}N_5$ | 38 |
| a40 | $[Fe]_{82}N_{18}$ | 36 |
| (Comparative example) a41 | $[Fe]_{77}N_{23}$ | 21 |

In Table 1, the elements other than those represented by the conventional and comparative examples are the working examples, though they are not so indicated (this is the same in the following). As shown in Table 1, larger MR ratios were obtained from the elements of the working examples than that from the conventional example a01. Moreover, some of the elements had an extremely large MR ratio of 50% or more. The increase in the MR ratio may result from an increase in spin polarization by adding the non-magnetic element to Fe.

For the elements marked with *, the degree of increase in the MR ratio was not large because the amount of non-magnetic element X added was rather large. To achieve a high MR ratio, the amounts of addition should be limited to 50 at % for Pt, Pd, Rh and Ir ($X^1$), 30 at % for Re ($X^2$), and 20 at % for N ($X^3$).

Moreover, the variation in tunnel junction resistance in a 3-inch wafer after processing the element was examined for each element in the conventional and working examples. The variation in junction resistance of the conventional example was about 18%. However, the variation in junction resistance of all the working examples was within 5%. The effect of mass-producing devices increases as the variation becomes smaller.

Example 2

Si substrate with a thermal oxide film/Ta(3)/Cu(50)/Ta (3)/Pt—Mn(20)/Co—Fe(3)/Ru(0.9)/Co—Fe(1)/ferromagnetic material M-X(2)/Al—O(1.0)/ferromagnetic material M-X(2)/Ni—Fe(5)/Ta(15)

The method for forming the Al—O film was the same as that in Example 1. Each film was processed in mesa fashion in the same manner as Example 1, and Cu(50)/Ta(3) was formed as an upper electrode. Subsequently, the element was heat-treated at 280° C. for 3 hours in a magnetic field of 5 kOe so as to impart unidirectional anisotropy to the Pt—Mn. The element area of a sample was 2 μm×3 μm.

This MR element is a laminated ferrimagnetic pinned layer spin-valve type TMR element having the configuration in accordance with FIG. 5, and a ferromagnetic material M-X is used for a portion of the pinned layer 1 and a portion of the free layer 3. The free layer 3 includes an Ni—Fe soft magnetic layer. The MR ratio of this element was examined in the same manner as Example 1. Table 2 shows the result.

TABLE 2

| Sample No. | Ferromagnetic material M-X (on the pinned layer side) | Ferromagnetic material M-X (on the free layer side) | MR(%) |
|---|---|---|---|
| (Conventional example) b01 | $[Fe]_{100}$ | $[Fe]_{100}$ | 18 |
| (Comparative example) b02 | $[Fe]_{99.96}Pt_{0.04}$ | $[Fe]_{99.96}Pt_{0.04}$ | 18 |
| b03 | $[Fe]_{95}Pt_5$ | $[Fe]_{95}Pt_5$ | 55 |
| b04 | $[Fe]_{85}Pt_{15}$ | $[Fe]_{85}Pt_{15}$ | 58 |
| b05 | $[Fe]_{75}Pt_{25}$ | $[Fe]_{75}Pt_{25}$ | 58 |
| b06 | $[Fe]_{65}Pt_{35}$ | $[Fe]_{65}Pt_{35}$ | 57 |
| b07 | $[Fe]_{55}Pt_{45}$ | $[Fe]_{55}Pt_{45}$ | 35 |
| *b08 | $[Fe]_{45}Pt_{55}$ | $[Fe]_{45}Pt_{55}$ | 19 |
| (Comparative example) b09 | $[Fe]_{37}Pt_{63}$ | $[Fe]_{37}Pt_{63}$ | 12 |
| b10 | $[Fe]_{90}Pt_{10}$ | $[Fe]_{70}Pt_{30}$ | 57 |
| b11 | $[Fe]_{80}Pt_{20}$ | $[Fe]_{55}Pt_{45}$ | 56 |
| *b12 | $[Fe]_{70}Pt_{30}$ | $[Fe]_{45}Pt_{55}$ | 20 |
| b13 | $[Fe]_{50}Pt_{50}$ | $[Fe]_{82}Pt_{18}$ | 44 |
| b14 | $[Fe]_{90}Pd_{10}$ | $[Fe]_{90}Pd_{10}$ | 48 |
| b15 | $[Fe]_{80}Pd_{20}$ | $[Fe]_{80}Pd_{20}$ | 50 |
| b16 | $[Fe]_{70}Pd_{30}$ | $[Fe]_{70}Pd_{30}$ | 51 |
| b17 | $[Fe]_{50}Pd_{50}$ | $[Fe]_{50}Pd_{50}$ | 41 |
| b18 | $[Fe]_{85}Pd_{15}$ | $[Fe]_{95}Pd_5$ | 55 |
| b19 | $[Fe]_{65}Pd_{35}$ | $[Fe]_{75}Pd_{25}$ | 48 |
| b20 | $[Fe]_{85}Pd_{15}$ | $[Fe]_{65}Pd_{35}$ | 46 |
| b21 | $[Fe]_{95}Pd_5$ | $[Fe]_{80}Pd_{20}$ | 45 |

As shown in Table 2, larger MR ratios were obtained from the elements of the working examples including the ferromagnetic material M-X compared with the conventional example, either when the compositions of the materials arranged on both sides of the Al—O were the same or when they were different. For the working examples b08, b12 marked with *, the degree of increase in the MR ratio was not large because the content of X(Pt) was rather large. In the conventional example b01, a magnetic field for reversing the magnetization of the free layer (i.e., a coercive force) was about 35 Oe. However, the coercive force of the working examples b08, b12 was about 10 Oe. A smaller magnetic field for reversing the magnetization of the free layer is advantageous in magnetic heads and magnetic memories. Thus, the ferromagnetic material M-X can improve the soft magnetic characteristics of the free layer and contribute to the enhancement of device sensitivity.

The elements of the conventional example b01 and all the working examples were heat-treated again at 280° C. for 10 hours, and then their MR characteristics were examined. The MR ratios of the conventional example b01 and the working examples changed little relative to those before reheating. When the tunnel junction resistance after reheating was compared with that before reheating, a change in the resistance of all the working examples was within 5%, while a change in the resistance of the conventional example b01 was 20% or more. High stability to thermal hysteresis increases the versatility and facilitates the element design.

Example 3

Si substrate with a thermal oxide film/Ta(3)/Cu(50)/Ta (3)/ferromagnetic material M-X(5)/Al—O(0.8)/Co(3)/Ir—Mn(15)/Ta(20)

The Al—O was prepared by forming an Al film having a thickness of 0.8 nm and applying ICP oxidation to the Al film. The Ir—Mn corresponds to an antiferromagnetic layer. Each film was processed in mesa fashion in the same manner as Example 1, and Cu(50)/Ta(3) was formed as an upper electrode. Subsequently, the element was heat-treated at 250° C. for 2 hours in a magnetic field of 5 kOe so as to impart unidirectional anisotropy to the Ir—Mn. The element area of a sample was 3 μm×3 μm.

Figure 2:
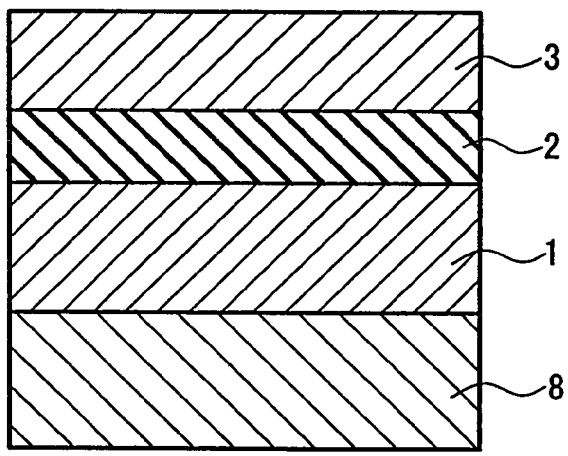
FIG. 2 is a cross-sectional view showing another example of a magnetoresistive element of the present invention.

This MR element is a spin-valve type TMR element having the configuration in accordance with FIG. 2, which is turned upside down, and a ferromagnetic material M-X is used for the free layer 3. The MR ratio of this element was examined in the same manner as Example 1. Table 3 shows the result.

TABLE 3

| Sample No. | Ferromagnetic material M-X | MR(%) |
|---|---|---|
| (Conventional example) c01 | [Fe$_{0.90}$Ni$_{0.10}$]$_{100}$ | 27 |
| (Comparative example) c02 | [Fe$_{0.90}$Ni$_{0.10}$]$_{99.97}$Pt$_{0.03}$ | 27 |
| c03 | [Fe$_{0.90}$Ni$_{0.10}$]$_{99.95}$Pt$_{0.05}$ | 35 |
| c04 | [Fe$_{0.90}$Ni$_{0.10}$]$_{95}$Pt$_5$ | 38 |
| c05 | [Fe$_{0.90}$Ni$_{0.10}$]$_{90}$Pt$_{10}$ | 53 |
| c06 | [Fe$_{0.90}$Ni$_{0.10}$]$_{75}$Pt$_{25}$ | 44 |
| c07 | [Fe$_{0.90}$Ni$_{0.10}$]$_{52}$Pt$_{48}$ | 44 |
| *c08 | [Fe$_{0.90}$Ni$_{0.10}$]$_{48}$Pt$_{52}$ | 28 |
| (Comparative example) c09 | [Fe$_{0.90}$Ni$_{0.10}$]$_{35}$Pt$_{65}$ | 16 |
| c10 | [Fe$_{0.90}$Ni$_{0.10}$]$_{88}$Ir$_{12}$ | 46 |
| c11 | [Fe$_{0.90}$Ni$_{0.10}$]$_{80}$Rh$_{20}$ | 43 |
| c12 | [Fe$_{0.90}$Ni$_{0.10}$]$_{92}$Pd$_8$ | 43 |
| c13 | [Fe$_{0.90}$Ni$_{0.10}$]$_{85}$Ru$_{15}$ | 30 |
| c14 | [Fe$_{0.90}$Ni$_{0.10}$]$_{85}$Au$_{15}$ | 29 |
| c15 | [Fe$_{0.90}$Ni$_{0.10}$]$_{95}$Re$_5$ | 34 |
| c16 | [Fe$_{0.90}$Ni$_{0.10}$]$_{85}$Re$_{15}$ | 33 |
| (Comparative example) c17 | [Fe$_{0.90}$Ni$_{0.10}$]$_{65}$Re$_{35}$ | 11 |
| c18 | [Fe$_{0.90}$Ni$_{0.10}$]$_{99}$O$_1$ | 30 |
| c19 | [Fe$_{0.90}$Ni$_{0.10}$]$_{95}$O$_5$ | 31 |
| (Comparative example) c20 | [Fe$_{0.90}$Ni$_{0.10}$]$_{77}$O$_{23}$ | 14 |
| (Conventional example) c21 | [Fe$_{0.60}$Ni$_{0.40}$]$_{100}$ | 31 |
| c22 | [Fe$_{0.60}$Ni$_{0.40}$]$_{96}$Pt$_4$ | 56 |
| c23 | [Fe$_{0.60}$Ni$_{0.40}$]$_{89}$Pt$_{11}$ | 58 |
| c24 | [Fe$_{0.60}$Ni$_{0.40}$]$_{92}$Ir$_8$ | 50 |
| c25 | [Fe$_{0.60}$Ni$_{0.40}$]$_{80}$Rh$_{20}$ | 48 |
| c26 | [Fe$_{0.60}$Ni$_{0.40}$]$_{90}$Pd$_{10}$ | 48 |
| c27 | [Fe$_{0.60}$Ni$_{0.40}$]$_{82}$Ru$_{18}$ | 44 |
| c28 | [Fe$_{0.60}$Ni$_{0.40}$]$_{90}$Au$_{10}$ | 38 |
| (Comparative example) c29 | [Fe$_{0.60}$Ni$_{0.40}$]$_{99.96}$Cr$_{0.04}$ | 31 |
| c30 | [Fe$_{0.60}$Ni$_{0.40}$]$_{99.95}$Cr$_{0.05}$ | 37 |
| c31 | [Fe$_{0.60}$Ni$_{0.40}$]$_{98}$Cr$_2$ | 45 |
| c32 | [Fe$_{0.60}$Ni$_{0.40}$]$_{95}$Cr$_5$ | 47 |
| c33 | [Fe$_{0.60}$Ni$_{0.40}$]$_{92}$Cr$_8$ | 45 |
| c34 | [Fe$_{0.60}$Ni$_{0.40}$]$_{80}$Cr$_{20}$ | 37 |
| (Comparative example) c35 | [Fe$_{0.60}$Ni$_{0.40}$]$_{69}$Cr$_{31}$ | 15 |
| (Comparative example) c36 | [Fe$_{0.60}$Ni$_{0.40}$]$_{99.97}$N$_{0.03}$ | 31 |
| c37 | [Fe$_{0.60}$Ni$_{0.40}$]$_{99.95}$N$_{0.05}$ | 35 |
| c38 | [Fe$_{0.60}$Ni$_{0.40}$]$_{97}$N$_3$ | 36 |
| c39 | [Fe$_{0.60}$Ni$_{0.40}$]$_{92}$N$_8$ | 34 |
| (Comparative example) c40 | [Fe$_{0.60}$Ni$_{0.40}$]$_{77}$N$_{23}$ | 5 |
| (Conventional example) c41 | [Fe$_{0.20}$Ni$_{0.80}$]$_{100}$ | 18 |
| c42 | [Fe$_{0.20}$Ni$_{0.80}$]$_{98}$Pt$_2$ | 26 |
| c43 | [Fe$_{0.20}$Ni$_{0.80}$]$_{91}$Pt$_9$ | 25 |
| c44 | [Fe$_{0.20}$Ni$_{0.80}$]$_{88}$Pt$_{12}$ | 28 |
| c45 | [Fe$_{0.20}$Ni$_{0.80}$]$_{95}$Cr$_5$ | 24 |
| c46 | [Fe$_{0.20}$Ni$_{0.80}$]$_{85}$Cr$_{15}$ | 20 |
| (Comparative example) c47 | [Fe$_{0.20}$Ni$_{0.80}$]$_{66}$Cr$_{34}$ | 11 |
| c48 | [Fe$_{0.20}$Ni$_{0.80}$]$_{99}$Si$_1$ | 19 |
| c49 | [Fe$_{0.20}$Ni$_{0.80}$]$_{92}$Si$_8$ | 21 |
| c50 | [Fe$_{0.20}$Ni$_{0.80}$]$_{83}$Si$_{17}$ | 20 |
| (Comparative example) c51 | [Fe$_{0.20}$Ni$_{0.80}$]$_{76}$Si$_{24}$ | 10 |

As shown in Table 3, larger MR ratios were obtained from the elements of the working examples including the ferromagnetic material M-X compared with the conventional examples, even if an Fe—Ni alloy was used as M. For the working example c08 marked with * in Table 3, a remarkable increase in the MR ratio was not observed.

Example 4

Si substrate with a thermal oxide film, Ta(3)/Cu(50)/Ta(3)/Ni—Fe—Cr(4)/Pt—Mn(25)/ferromagnetic material M-X(2.5)/Al—O(0.7)/Co—Fe(2)/Ni—Fe(3)/Ta(20)

The method for forming the Al—O film was the same as that in Example 1. The Ta(3)/Ni—Fe—Cr(4) is an underlying layer for controlling the crystal orientation of the Pt—Mn. Each film was processed in mesa fashion in the same manner as Example 1, and Cu(50)/Ta(3) was formed as an upper electrode. Subsequently, the element was heat-treated at 280° C. for 5 hours in a magnetic field of 5 kOe so as to impart unidirectional anisotropy to the Pt—Mn. The element area of a sample was 1.5 μm×3 μm.

This MR element is a spin-valve type TMR element having the configuration in accordance with FIG. 2, and a ferromagnetic material M-X is used for the pinned layer 1. The MR ratio of this element was examined in the same manner as Example 1. Table 4 shows the result.

TABLE 4

| Sample No. | Ferromagnetic material M-X | MR(%) |
|---|---|---|
| (Conventional example) d01 | [Fe$_{0.70}$Co$_{0.30}$]$_{100}$ | 30 |
| (Comparative example) d02 | [Fe$_{0.70}$Co$_{0.30}$]$_{99.96}$Pt$_{0.04}$ | 30 |
| d03 | [Fe$_{0.70}$Co$_{0.30}$]$_{99}$Pt$_1$ | 40 |
| d04 | [Fe$_{0.70}$Co$_{0.30}$]$_{92}$Pt$_8$ | 48 |
| d05 | [Fe$_{0.70}$Co$_{0.30}$]$_{84}$Pt$_{16}$ | 45 |
| d06 | [Fe$_{0.70}$Co$_{0.30}$]$_{70}$Pt$_{30}$ | 42 |
| *d07 | [Fe$_{0.70}$Co$_{0.30}$]$_{47}$Pt$_{53}$ | 31 |
| (Comparative example) d08 | [Fe$_{0.70}$Co$_{0.30}$]$_{39}$Pt$_{61}$ | 16 |
| (Comparative example) d09 | [Fe$_{0.70}$Co$_{0.30}$]$_{99.96}$V$_{0.04}$ | 30 |
| d10 | [Fe$_{0.70}$Co$_{0.30}$]$_{96}$V$_4$ | 38 |
| d11 | [Fe$_{0.70}$Co$_{0.30}$]$_{92}$V$_8$ | 36 |
| (Comparative example) d12 | [Fe$_{0.70}$Co$_{0.30}$]$_{68}$V$_{32}$ | 11 |
| d13 | [Fe$_{0.70}$Co$_{0.30}$]$_{99}$N$_1$ | 33 |
| d14 | [Fe$_{0.70}$Co$_{0.30}$]$_{95}$N$_5$ | 34 |
| (Comparative example) d15 | [Fe$_{0.70}$Co$_{0.30}$]$_{78}$N$_{22}$ | 9 |
| (Conventional example) d16 | [Fe$_{0.30}$Co$_{0.70}$]$_{100}$ | 38 |
| d17 | [Fe$_{0.30}$Co$_{0.70}$]$_{99}$Pt$_1$ | 43 |
| d18 | [Fe$_{0.30}$Co$_{0.70}$]$_{92}$Pt$_8$ | 55 |
| d19 | [Fe$_{0.30}$Co$_{0.70}$]$_{65}$Pt$_{35}$ | 44 |
| d20 | [Fe$_{0.30}$Co$_{0.70}$]$_{90}$Pd$_{10}$ | 46 |
| d21 | [Fe$_{0.30}$Co$_{0.70}$]$_{95}$Ru$_5$ | 42 |
| d22 | [Fe$_{0.30}$Co$_{0.70}$]$_{75}$Cu$_{25}$ | 44 |
| d23 | [Fe$_{0.30}$Co$_{0.70}$]$_{55}$Cu$_{45}$ | 41 |
| d24 | [Fe$_{0.30}$Co$_{0.70}$]$_{90}$Cr$_{10}$ | 41 |
| d25 | [Fe$_{0.30}$Co$_{0.70}$]$_{99.5}$O$_{0.5}$ | 46 |
| d26 | [Fe$_{0.30}$Co$_{0.70}$]$_{99}$O$_1$ | 41 |
| d27 | [Fe$_{0.30}$Co$_{0.70}$]$_{92}$O$_8$ | 44 |
| (Comparative example) d28 | [Fe$_{0.30}$Co$_{0.70}$]$_{75}$O$_{25}$ | 10 |
| (Conventional example) d29 | [Fe$_{0.10}$Co$_{0.90}$]$_{100}$ | 32 |
| d30 | [Fe$_{0.10}$Co$_{0.90}$]$_{95}$Pt$_5$ | 52 |
| d31 | [Fe$_{0.10}$Co$_{0.90}$]$_{90}$Pt$_{10}$ | 40 |
| d32 | [Fe$_{0.10}$Co$_{0.90}$]$_{75}$Pt$_{25}$ | 41 |
| d33 | [Fe$_{0.10}$Co$_{0.90}$]$_{99}$O$_1$ | 36 |
| d34 | [Fe$_{0.10}$Co$_{0.90}$]$_{98}$O$_2$ | 35 |
| d35 | [Fe$_{0.10}$Co$_{0.90}$]$_{95}$O$_5$ | 33 |
| (Comparative example) d36 | [Fe$_{0.10}$Co$_{0.90}$]$_{70}$O$_{30}$ | 5 |

As shown in Table 4, larger MR ratios were obtained from the elements of the working examples including the ferromagnetic material M-X compared with the conventional examples, even if an Fe—Co alloy was used as M. For the working example d07 marked with * in Table 4, a remarkable increase in the MR ratio was not observed.

Example 5

Si substrate with a thermal oxide film/Ta(3)/Cu(50)/Ta(3)/Co—Sm(80)/Co—Fe(3)/Al—O(1.1)/ferromagnetic material M-X(5)/Ta(20)

The Al—O was prepared by forming an Al film having a thickness of 0.3 to 0.7 nm and applying ICP oxidation to the Al film. The Co—Sm corresponds to a high coercivity layer. Each film was processed in mesa fashion in the same manner as Example 1, and Cu(50)/Ta(3) was formed as an upper electrode. Subsequently, the element was heat-treated at 150° C. for 1 hour in a magnetic field of 500 Oe so as to impart crystal magnetic anisotropy to the Co—Sm. The element area of a sample was 4 μm×5 μm.

This MR element is a differential coercive force type TMR element having the configuration in accordance with FIG. 1, and a ferromagnetic material M-X is used for the free layer 3. The MR ratio of this element was examined in the same manner as Example 1. Table 5 shows the result, together with the ratio of the MR ratio (MR(M-X)) of the above element to the MR ratio (MR(M)) of an element that used a ferromagnetic material M for the free layer 3.

TABLE 5

| Sample No. | Ferromagnetic material M-X | MR(%) | MR(M-X)/MR(M) |
|---|---|---|---|
| (Conventional example) e01 | $[Fe_{0.80}Co_{0.10}Ni_{0.10}]_{100}$ | 30 | 1.00 |
| e02 | $[Fe_{0.80}Co_{0.10}Ni_{0.10}]_{95}Pt_5$ | 41 | 1.37 |
| e03 | $[Fe_{0.80}Co_{0.10}Ni_{0.10}]_{84}Pt_{16}$ | 45 | 1.50 |
| e04 | $[Fe_{0.80}Co_{0.10}Ni_{0.10}]_{63}Pt_{37}$ | 40 | 1.33 |
| (Conventional example) e05 | $[Fe_{0.45}Co_{0.30}Ni_{0.25}]_{100}$ | 31 | 1.19 |
| e06 | $[Fe_{0.45}Co_{0.30}Ni_{0.25}]_{96}Pt_4$ | 48 | 1.85 |
| e07 | $[Fe_{0.45}Co_{0.30}Ni_{0.25}]_{85}Pt_{15}$ | 43 | 1.65 |
| e08 | $[Fe_{0.45}Co_{0.30}Ni_{0.25}]_{70}Pt_{30}$ | 38 | 1.46 |
| (Conventional example) e09 | $[Fe_{0.20}Co_{0.15}Ni_{0.65}]_{100}$ | 18 | 1.00 |
| e10 | $[Fe_{0.20}Co_{0.15}Ni_{0.65}]_{99}Pt_1$ | 20 | 1.11 |
| e11 | $[Fe_{0.20}Co_{0.15}Ni_{0.65}]_{93}Pt_7$ | 25 | 1.39 |
| e12 | $[Fe_{0.20}Co_{0.15}Ni_{0.65}]_{80}Pt_{20}$ | 22 | 1.22 |
| (Conventional example) e13 | $[Fe_{0.20}Co_{0.10}Ni_{0.70}]_{100}$ | 17 | 1.00 |
| e14 | $[Fe_{0.20}Co_{0.10}Ni_{0.70}]_{95}Pt_5$ | 20 | 1.18 |
| e15 | $[Fe_{0.20}Co_{0.10}Ni_{0.70}]_{90}Pt_{10}$ | 18 | 1.06 |
| (Conventional example) e16 | $[Fe_{0.05}Co_{0.05}Ni_{0.90}]_{100}$ | 15 | 1.00 |
| e17 | $[Fe_{0.05}Co_{0.05}Ni_{0.90}]_{96}Pt_4$ | 17 | 1.13 |
| e18 | $[Fe_{0.05}Co_{0.05}Ni_{0.90}]_{85}Pt_{15}$ | 16 | 1.07 |

As shown in Table 5, larger MR ratios were obtained from the elements of the working examples including the ferromagnetic material M-X compared with the conventional examples, even if an Fe—Co—Ni ternary alloy was used as M. In particular, the MR ratio was increased when the composition ratio (q) of Ni was 0.65 or less.

Example 6

Si substrate with a thermal oxide film Ta(3)/Cu(50)/Ta(3)/Ni—Fe(3)/Pt—Mn(20)/Co—Fe(3)/Ru(0.9)/Co—Fe(3)/Al—N(1.0)/ferromagnetic material M-X(5)/Ta(20)

The Al—N was prepared by forming an Al film having a thickness of 1.0 nm and applying ICP nitridation to the Al film. The ICP nitridation was performed in an atmosphere containing nitrogen. The Ta(3)/Ni—Fe(3) is an underlying layer for the Pt—Mn. Each film was processed in mesa fashion in the same manner as Example 1, and Cu(50)/Ta(3) was formed as an upper electrode. Subsequently, the element was heat-treated at 280° C. for 3 hours in a magnetic field of 10 kOe so as to impart unidirectional anisotropy to the Pt—Mn. The element area of a sample was 2 μm×4 μm.

This MR element is a laminated ferrimagnetic pinned layer spin-valve type TMR element, and the Co—Fe(3)/Ru(0.9)/Co—Fe(3) acts as a pinned layer. A ferromagnetic material M-X is used for the free layer 3. The MR ratio of this element was examined in the same manner as Example 1. Table 6 shows the result.

TABLE 6

| Sample No. | Ferromagnetic material M-X | MR(%) |
|---|---|---|
| (Conventional example) f01 | $[Fe]_{100}$ | 20 |
| f02 | $[Fe]_{90}Pt_5Pd_5$ | 41 |
| f03 | $[Fe]_{75}Pt_{10}Pd_{15}$ | 38 |
| f04 | $[Fe]_{78}Pt_{14}Pd_8$ | 42 |
| f05 | $[Fe]_{51}Pt_{35}Pd_{14}$ | 35 |
| (Comparative example) f06 | $[Fe]_{35}Pt_{25}Pd_{40}$ | 8 |
| f07 | $[Fe]_{70}Pt_{28}Re_2$ | 46 |
| f08 | $[Fe]_{70}Pt_{24}Re_6$ | 42 |
| f09 | $[Fe]_{70}Pt_{18}Re_{12}$ | 38 |
| *f10 | $[Fe]_{60}Pt_{15}Re_{25}$ | 21 |
| (Comparative example) f11 | $[Fe]_{47}Pt_{18}Re_{35}$ | 6 |
| (Comparative example) f12 | $[Fe]_{37}Pt_{48}Re_{15}$ | 3 |
| f13 | $[Fe]_{84}Pt_{15}O_1$ | 34 |
| f14 | $[Fe]_{78}Pt_{17}O_5$ | 31 |
| f15 | $[Fe]_{68}Pt_{20}O_{12}$ | 30 |
| (Comparative example) f16 | $[Fe]_{63}Pt_{15}O_{22}$ | 11 |
| f17 | $[Fe]_{90}Rh_5Ir_5$ | 38 |
| f18 | $[Fe]_{82}Rh_{10}Ir_8$ | 39 |
| f19 | $[Fe]_{59}Rh_{35}Ir_6$ | 37 |
| f20 | $[Fe]_{55}Rh_{40}Ir_5$ | 37 |
| (Comparative example) f21 | $[Fe]_{35}Rh_{35}Ir_{30}$ | 3 |
| (Conventional example) f22 | $[Fe_{0.80}Ni_{0.20}]_{100}$ | 29 |
| f23 | $[Fe_{0.80}Ni_{0.20}]_{86}Rh_{10}Ir_4$ | 51 |
| f24 | $[Fe_{0.80}Ni_{0.20}]_{80}Rh_{12}Ir_8$ | 48 |
| f25 | $[Fe_{0.80}Ni_{0.20}]_{89}Al_6P_5$ | 33 |
| f26 | $[Fe_{0.80}Ni_{0.20}]_{81}Al_3P_{16}$ | 34 |
| (Comparative example) f27 | $[Fe_{0.80}Ni_{0.20}]_{74}Al_3P_{23}$ | 15 |

As shown in Table 6, larger MR ratios compared with the conventional examples were obtained, even if two nonmagnetic elements were used as X. For the working example f10 marked with * in Table 6, a remarkable increase in the MR ratio was not observed. It is preferable that Re should be added in the range of not more than 20%.

Example 7

Si substrate with a thermal oxide film/Ta(3)/Cu(50)/Ta(3)/Ni—Fe—Cr(4)/Pt—Mn(20)/Co—Fe(3)/Ru(0.9)/Co—

Fe(1.5)/ferromagnetic material M-X(1.5)/Al—O(0.8)/ferromagnetic material M-X(1)/Ni—Fe(5)/Ta(15)

The method for forming the Al—O film was the same as that in Example 1. Each film was processed in mesa fashion in the same manner as Example 1, and Cu(50)/Ta(3) was formed as an upper electrode. Subsequently, the element was heat-treated under the same conditions as those in Example 1 so as to impart unidirectional anisotropy to the Pt—Mn. The element area of a sample was 2 μm×3 μm.

This MR element is a laminated ferrimagnetic pinned layer spin-valve type TMR element having the configuration in accordance with FIG. 5, and a ferromagnetic material M-X is used for a portion of the pinned layer 1 and a portion of the free layer 3. The compositions of the ferromagnetic material M-X in both magnetic layers are the same. The free layer 3 includes an Ni—Fe soft magnetic layer to cause its magnetization rotation more easily. The MR ratio of this element was examined in the same manner as Example 1. Table 7 shows the result.

TABLE 7

| Sample No. | Ferromagnetic material M-X | MR(%) |
|---|---|---|
| (Conventional example) g01 | $[Fe]_{100}$ | 26 |
| g02 | $[Fe]_{93}Pt_5Al_1O_1$ | 44 |
| g03 | $[Fe]_{83.9}Pt_{15}Al_1O_{0.1}$ | 45 |
| g04 | $[Fe]_{81}Pt_{15}Al_3O_1$ | 48 |
| g05 | $[Fe]_{70}Pt_{30}Al_5O_5$ | 45 |
| g06 | $[Fe]_{60}Pt_{22}Al_{15}O_3$ | 44 |
| g07 | $[Fe]_{49}Pt_{21}Al_{25}O_5$ | 41 |
| (Comparative example) g08 | $[Fe]_{45}Pt_{15}Al_{35}O_5$ | 12 |
| g09 | $[Fe]_{64}Pt_{25}Al_3O_8$ | 44 |
| g10 | $[Fe]_{45}Pt_{35}Al_5O_{15}$ | 46 |
| (Comparative example) g11 | $[Fe]_{52}Pt_{17}Al_{10}O_{21}$ | 9 |
| (Comparative example) g12 | $[Fe]_{39}Pt_{48}Al_8O_5$ | 19 |

As shown in Table 7, larger MR ratios compared with the conventional example were obtained, even if three nonmagnetic elements ($X^1$, $X^2$, $X^3$) were used as X. However, when Al($X^2$) was more than 30%, O($X^3$) was more than 20%, or the total (X) of Pt, Al and O was more than 60%, the MR ratio became even smaller.

Example 8

Si substrate with a thermal oxide film/Ta(3)/Cu(50)/Ta(3)/Ni—Fe(3)/Ir—Mn(15)/Co—Fe(1)/ferromagnetic material M-X(2)/Al—O(1.0)/Ni—Fe(4)/Ru(0.8)/Ni—Fe(3)/Ta(20)

The Al—O was prepared by forming an Al film having a thickness of 0.4 nm, oxidizing the Al film in an atmosphere containing oxygen (200 Torr, 1 min), further forming an Al film having a thickness of 0.6 nm, and oxidizing the Al film with ICP oxidation. Each film was processed in mesa fashion in the same manner as Example 1, and Cu(50)/Ta(3) was formed as an upper electrode. Subsequently, the element was heat-treated at 260° C. for 3 hours in a magnetic field of 5 kOe so as to impart unidirectional anisotropy to the Ir—Mn. The element area of a sample was 2.5 μm×4 μm.

This MR element is a spin-valve type TMR element having the configuration in accordance with FIG. 3, and a ferromagnetic material M-X is used for a portion of the pinned layer 1. The laminated ferrimagnetic free layer (Ni—Fe(4)/Ru(0.8)/Ni—Fe(3)) is used as the free layer 3. The MR ratio of this element was examined in the same manner as Example 1. Table 8 shows the result, together with a coercive force (Hc) of the laminated ferrimagnetic free layer and a shift magnetic field (Hint) from the zero magnetic field. When the magnetic fields for reversing the magnetization 10 of the free layer are represented by $H_1$ and $H_2$ $(H_1>H_2)$, the coercive force (Hc) is expressed by Hc=$(H_1-H_2)/2$ and the shift magnetic field (Hint) is expressed by Hint=$(H_1+H_2)/2$.

TABLE 8

| Sample No. | Ferromagnetic material M-X | MR(%) | Hc(Oe) | Hint(Oe) |
|---|---|---|---|---|
| (Conventional example) h01 | $[Fe_{0.65}Ni_{0.35}]_{100}$ | 25 | 45 | 30 |
| h02 | $[Fe_{0.65}Ni_{0.35}]_{98}Mn_2$ | 38 | 21 | 5 |
| h03 | $[Fe_{0.65}Ni_{0.35}]_{92}Mn_8$ | 37 | 16 | 4 |
| h04 | $[Fe_{0.65}Ni_{0.85}]_{86}Mn_{14}$ | 34 | 15 | 6 |
| h05 | $[Fe_{0.65}Ni_{0.35}]_{75}Mn_{25}$ | 36 | 14 | 7 |
| h06 | $[Fe_{0.65}Ni_{0.35}]_{99}Cr_1$ | 31 | 19 | 6 |
| h07 | $[Fe_{0.65}Ni_{0.35}]_{92}Cr_8$ | 36 | 14 | 5 |
| h08 | $[Fe_{0.65}Ni_{0.35}]_{80}Cr_{20}$ | 30 | 16 | 4 |
| h09 | $[Fe_{0.65}Ni_{0.35}]_{94}V_6$ | 34 | 13 | 6 |
| h10 | $[Fe_{0.65}Ni_{0.35}]_{95}Pt_5$ | 44 | 16 | 8 |
| h11 | $[Fe_{0.65}Ni_{0.35}]_{90}Pd_{10}$ | 41 | 19 | 6 |
| h12 | $[Fe_{0.65}Ni_{0.35}]_{92}Ir_8$ | 40 | 14 | 4 |
| h13 | $[Fe_{0.65}Ni_{0.35}]_{88}Rh_{12}$ | 42 | 15 | 5 |
| h14 | $[Fe_{0.65}Ni_{0.35}]_{84}Ru_{16}$ | 38 | 18 | 2 |

As shown in Table 8, the ferromagnetic material M-X enabled a larger MR ratio compared with the conventional example and a considerable reduction in the coercive force (Hc) of the laminated ferrimagnetic free layer and the shift magnetic field (Hint) from the zero magnetic field. By using the ferromagnetic material, an element having an MR ratio of 30% or more, Hc of 25 Oe or less, and Hint of 10 Oe or less was obtained. Thus, the ferromagnetic material M-X also is effective in improving the soft magnetic characteristics. A smaller Hint can improve the symmetry of reproduction output in a magnetic head and the symmetry of a current field for writing in a magnetic memory. Therefore, the element design can be simplified and the power consumption can be reduced as well. The reason for such a reduction in Hc and Hint is considered to be that the interface to join the ferromagnetic material M-X and the Al—O tunnel layer is improved at the atomic level so as to improve the soft magnetic characteristics of the free layer.

Example 9

Si substrate with a thermal oxide film Ta(3)/Cu(50)/Ta(3)/ferromagnetic material M-X(5)/Al—O(1.0)/Co(3)/Ru(0.7)/Co(3)/Ir M(20)/Ta(25)

The Al—O was prepared in the same manner as Example 1. Each film was processed in mesa fashion in the same manner as Example 1, and Cu(50)/Ta(3) was formed as an upper electrode. Subsequently, the element was heat-treated at 280° C. for 3 hours in a magnetic field of 10 kOe so as to impart unidirectional anisotropy to the Ir—Mn. The element area of a sample was 2.5 μm×4 μm.

This MR element is a laminated ferrimagnetic pinned layer spin-valve type TMR element, and a ferromagnetic material M-X is used for the free layer 3.

In this example, elements that include the ferromagnetic material M-X having a composition gradient also were produced. Specifically, the ferromagnetic material M-X was formed by the following three methods.

Method (1): a magnetic element M and a non-magnetic element X are sputtered simultaneously while keeping the deposition rate of both elements constant.

Method (2): a magnetic element M and a non-magnetic element X are sputtered simultaneously while changing the deposition rate of both elements with time.

Method (3): a magnetic element M and a non-magnetic element X are sputtered alternately.

In any of the methods, the composition of the ferromagnetic material M-X is adjusted to be the same ($Fe_{85}Pt_{15}$) as a whole in the entire range of film thickness. The MR ratio of this element was examined in the same manner as Example 1. Table 9 shows the result.

TABLE 9

| Sample No. | Methods for producing Fe—Pt | MR(%) |
|---|---|---|
| (Conventional example) i01 | Fe was sputtered in a general manner. | 28 |
| i02 | Fe and Pt were sputtered simultaneously while keeping the deposition rate of both elements constant (the method (1)). | 45 |
| i03 | Fe and Pt were sputtered simultaneously while keeping the deposition rate of Fe constant and increasing the deposition rate of Pt gradually with deposition time (the method (2)). | 42 |
| i04 | Fe and Pt were sputtered simultaneously while keeping the deposition rate of Fe constant and decreasing the deposition rate of Pt gradually with deposition time (the method (2)). | 43 |
| i05 | Fe and Pt were sputtered simultaneously while keeping the deposition rate of Fe constant and increasing the deposition rate of Pt in the middle of deposition time (the method (2)). | 44 |
| i06 | Fe and Pt were sputtered alternately to form a laminated film having a thickness of 0.05 μm to 1 μm (the method (3)). | 44 |

The elementary analysis based on Auger electron spectroscopy (AES) and secondary ion mass spectrometry (SIMS) confirmed that the ferromagnetic materials Fe—Pt in the working examples i03 to i05 had a composition gradient in the film thickness direction that corresponds to the ratio of deposition rate. The free layer of the working example i06 changed periodically in the film thickness direction. Table 9 shows that the ferromagnetic material M-X can increase the MR ratio, even if it is not uniform in the film.

Example 10

Si substrate with a thermal oxide film/Ta(3)/Cu(50)/Ta (3)/Pt—Mn(20)/Co—Fe(3)/Ru(0.7)/Co—Fe(2)/ferromagnetic material M-X (a) (1)/Al—O(0.7)/ferromagnetic material M-X (b) (1)/Ni—Fe(6)/Ta(25)

The Al—O was prepared by forming an Al film having a thickness of 0.7 nm and applying ICP oxidation to the Al film. Each film was processed in mesa fashion in the same manner as Example 1, and Cu(50)/Ta(3) was formed as an upper electrode. Subsequently, the element was heat-treated at 280° C. for 3 hours in a magnetic field of 10 kOe so as to impart unidirectional anisotropy to the Pt—Mn. The element area of a sample was 2.5 μm×3.5 μm.

This MR element is a laminated ferrimagnetic pinned layer spin-valve type TMR element having the configuration in accordance with FIG. 5, and a ferromagnetic material M-X (a) is used for a portion of the pinned layer 1 and a ferromagnetic material M-X (b) is used for a portion of the free layer 3. The free layer includes an Ni—Fe soft magnetic layer. The MR ratio of this element was examined in the same manner as Example 1. Table 10 shows the result.

TABLE 10

| Sample No. | Ferromagnetic material M-X (a) | Ferromagnetic material M-X (b) | MR(%) |
|---|---|---|---|
| (Conventional example) j01 | $[Fe]_{100}$ | $[Fe]_{100}$ | 28 |
| j02 | $[Fe]_{84}Pt_{16}$ | $[Fe]_{92}Pd_8$ | 51 |
| j03 | $[Fe]_{80}Pt_{20}$ | $[Fe]_{80}Rh_{20}$ | 44 |
| j04 | $[Fe]_{90}Pt_{10}$ | $[Fe]_{94}Re_6$ | 41 |
| j05 | $[Fe]_{84}Pt_{16}$ | $[Fe]_{88}Ru_{12}$ | 38 |
| (Conventional example) j06 | $[Fe_{0.75}Co_{0.25}]_{100}$ | $[Fe_{0.20}Ni_{0.80}]_{100}$ | 25 |
| j07 | $[Fe_{0.75}Co_{0.25}]_{85}Pt_{15}$ | $[Fe_{0.20}Ni_{0.80}]_{95}Pt_5$ | 52 |
| j08 | $[Fe_{0.75}Co_{0.25}]_{95}Pd_5$ | $[Fe_{0.20}Ni_{0.80}]_{90}Pd_{10}$ | 46 |
| (Conventional example) j09 | $[Fe]_{100}$ | $[Fe_{0.10}Co_{0.90}]_{100}$ | 30 |
| j10 | $[Fe]_{88}Pt_{12}$ | $[Fe_{0.10}Co_{0.90}]_{90}Pd_{10}$ | 50 |
| j11 | $[Fe]_{86}Pd_{14}$ | $[Fe_{0.10}Co_{0.90}]_{94}Rh_6$ | 46 |

As shown in Table 10, larger MR ratios were obtained by using the ferromagnetic material M-X, even if M and X included in the opposing magnetic layers via the non-magnetic layer were different.

Example 11

Si substrate with a thermal oxide film/Ta(3)/Cu(50)/Ta (3)/ferromagnetic material M-X(5)/Al—O(0.7)/Co—Fe(3)/ Ru(0.8)/Co—Fe(3)/Pt—Mn(20)/Ta(25)

The Al—O was prepared in the same manner as Example 1. Each film was processed in mesa fashion in the same manner as Example 1, and Cu(50)/Ta(3) was formed as an upper electrode. Subsequently, the element was heat-treated at 280° C. for 3 hours in a magnetic field of 10 kOe so as to impart unidirectional anisotropy to the Pt—Mn. The element area of a sample was 3 μm×4 μm.

This MR element is a laminated ferrimagnetic pinned layer spin-valve type TMR element, and a ferromagnetic material M-X is used for the free layer 3. The MR ratio of this element was examined in the same manner as Example 1. Moreover, the crystal structure of the free layer of the MR element was examined by X-ray diffraction with a high-resolution transmission electron microscope. Table 11 shows the result.

TABLE 11

| Sample No. | Ferromagnetic material M-X | MR(%) | Crystal structure |
|---|---|---|---|
| (Conventional example) k01 | $[Fe]_{100}$ | 31 | bcc |
| k02 | $[Fe]_{60}Pt_{40}$ | 57 | bcc, fcc |
| k03 | $[Fe]_{75}Pt_{20}O_5$ | 45 | bcc, fcc, microcrystal |

TABLE 11-continued

| Sample No. | Ferromagnetic material M-X | MR(%) | Crystal structure |
|---|---|---|---|
| k04 | $[Fe]_{90}Re_{10}$ | 43 | bcc, hcp, bct |
| k05 | $[Fe]_{75}Pd_{25}$ | 47 | bcc, fcc |
| (Conventional example) k06 | $[Fe_{0.40}Ni_{0.60}]_{100}$ | 26 | fcc |
| k07 | $[Fe_{0.40}Ni_{0.60}]_{85}Cr_{15}$ | 45 | fcc, bcc, bct |
| k08 | $[Fe_{0.40}Ni_{0.60}]_{85}B_{15}$ | 38 | microcrystal |

The free layers of the working examples k02 to k05 had a crystal structure other than bcc, while Fe of the conventional example k01 had the bcc structure. Higher MR ratios were obtained from the working examples k02 and k03 including fcc. Similarly, the free layers of the working examples K07, k08 had a crystal structure other than fcc, while Fe—Ni of the conventional example k06 had the fcc structure. A higher MR ratio was obtained from the working example k07 including bcc. The working examples k03, k08 included microcrystals, whose average crystal grain diameter was 10 nm or less. These results are considered to show the correlation between changes in crystal structure and in spin polarization. Here, when the average crystal grain diameter is not more than 10 nm, the crystal structure is recognized as microcrystal.

Example 12

Conventional example 101:

Si substrate with a thermal oxide film/Ta(3)/Cu(50)/Ta(3)/Pt—Mn(20)/Co—Fe(3)/Ru(0.8)/Co—Fe(3)/Al—O(1.0)/Ni—Fe(3)/Al—O(1.0)/Co—Fe(3)/Ru(0.8)/Co—Fe(3)/Pt—Mn(20)/Ta(15)

Working example 102:

Si substrate with a thermal oxide film Ta(3)/Cu(50)/Ta(3)/Pt—Mn(20)/Co—Fe(3)/Ru(0.8)/Co—Fe(1)/Fe—Pt(2)/Al—O(1.0)/Fe—Pt(3)/Al—O(1.0)/Fe—Pt(2)/Co—Fe(1)/Ru(0.8)/Co—Fe(3)/Pt—Mn(20)/Ta(15)

The Al—O was prepared in the same manner as Example 1. Each film was processed in mesa fashion in the same manner as Example 1, and Cu(50)/Ta(3) was formed as an upper electrode. Subsequently, the element was heat-treated at 280° C. for 3 hours in a magnetic field of 10 kOe so as to impart unidirectional anisotropy to the Pt—Mn. The element area of a sample was 2 μm×3 μm.

This element is a dual spin-valve type TMR (i.e., a dual tunnel junction TMR film), as shown in FIG. 7. In the working example 102, a ferromagnetic material M-X (FePt) is used for a portion of the pinned layer and the free layer. The composition of FePt is $Fe_{85}Pt_{15}$.

The bias dependence of the MR characteristics of this element was examined in the same manner as Example 1. Table 12 shows bias voltages ($V_h$) at which the MR ratio is reduced by half. The bias voltages ($V_h$) of the elements having a single tunnel junction (the working example b04 and the conventional example b01, see Example 2) were measured as well. Table 12 shows the result.

TABLE 12

| Sample No. | Voltage at which the MR ratio is reduced by half $V_h$(mV) |
|---|---|
| (Conventional example) l01 | 950 |
| (Working example) l02 | 1800 |
| (Conventional example) b01 | 350 |
| (Working example) b04 | 700 |

As shown in Table 12, the bias voltage ($V_h$) was improved significantly by using the ferromagnetic material M-X for both the dual tunnel junction (the working example l02 and the conventional example l01) and the single tunnel junction (the working example b04 and the conventional example b01). Therefore, the MR element of the present invention has superiority in achieving a large-capacity high-speed MRAM.

Example 13

Si substrate with a thermal oxide film Ta(3)/Cu(50)/Ta(3)/Ni—Fe—Cr(4)/Pt—Mn(20)/Co—Fe(3)/Ru(0.8)/Co—Fe(1)/ferromagnetic material M-X(3)/Cu(3)/ferromagnetic material M-X(1)/Ni—Fe(3)/Ta(15)

Each film was processed in mesa fashion in the same manner as Example 1, and Cu(50)/Ta(3) was formed as an upper electrode. Subsequently, the element was heat-treated at 280° C. for 5 hours in a magnetic field of 5 kOe so as to impart unidirectional anisotropy to the Pt—Mn. The element area of a sample was 0.5 μm×0.5 μm.

This MR element is a so-called CPP-GMR element, which has a laminated ferrimagnetic pinned layer spin-valve type configuration in accordance with FIG. 5 and a non-magnetic layer made of Cu (a conductive material). A ferromagnetic material M-X is used for a portion of the pinned layer 1 and a portion of the free layer 3. The free layer 3 includes an Ni—Fe soft magnetic layer. The MR characteristics of this element were examined in the same manner as Example 1.

Table 13 shows the amount of change in resistance (ΔR), together with the amount of change in resistance when the element area was 1 μm².

TABLE 13

| Sample No. | Ferromagnetic material M-X | ΔR(mΩ) | ΔR for 1 μm² (mΩ · μm²) |
|---|---|---|---|
| (Conventional example) m01 | $[Fe]_{100}$ | 1.6 | 0.40 |
| m02 | $[Fe]_{65}Pt_{35}$ | 204 | 51 |
| m03 | $[Fe]_{70}Pd_{30}$ | 184 | 46 |
| (Conventional example) m04 | $[Fe_{0.10}Co_{0.90}]_{100}$ | 2.2 | 0.55 |
| m05 | $[Fe_{0.10}Co_{0.90}]_{80}Pt_{20}$ | 212 | 53 |
| m06 | $[Fe_{0.10}Co_{0.90}]_{90}Pd_{10}$ | 200 | 50 |

As shown in Table 13, the amount of change in resistance was increased by using the ferromagnetic material M-X and thus output was improved, even in the CPP-GMR element. This may relates to the fact that the scattering probability of spin dependence between Fe—Pt and the Cu layer was increased and the resistance of Fe—Pt was relatively large.

Example 14

Using the CPP-GMR films of the working examples M02, M06 and the conventional example M04, a shield-type magnetoresistive magnetic head having the structure illustrated in FIG. 11 was produced. An $Al_2O_3$—TiC substrate was used for the substrate (not shown in FIG. 11), an $Ni_{0.8}Fe_{0.2}$ plated alloy for the recording magnetic pole 38 and the magnetic shields 31, 35, $Al_2O_3$ for the insulating film 36, and Au for the electrodes 32, 34.

Anisotropy was imparted to the magnetic film so that the direction of easy magnetization of the free layer provided with the soft magnetic layer (ferromagnetic material M-X(1)/Ni—Fe(3)) was perpendicular to the direction of a signal magnetic field to be detected, and the axis of easy magnetization of the pinned layer provided with the antiferromagnetic layer (Pt—Mn(20)/Co—Fe(3)/Ru(0.8)/Co—Fe(4)/ferromagnetic material M-X(2)) was parallel to that direction. Specifically, after the formation of the MR element, the direction of easy magnetization of the pinned layer was determined by performing heat treatment at 280° C. in a magnetic field of 5 kOe, and then the axis of easy magnetization of the free layer was determined by performing heat treatment at 200° C. in a magnetic field of 100 Oe while applying the magnetic field perpendicular to the direction of easy magnetization of the pinned layer.

The track width of the reproducing portion of the CPP-GMR element was 0.1 μm, and the MR height was also 0.1 μm. A direct current was supplied as a sense current to these heads, and outputs of the heads were evaluated by applying an alternating-current signal magnetic field of 50 Oe. Though no output was obtained from the conventional example M04, an output of not less than 15 mV/μm was obtained from the working examples M02, m06. A commercially available GMR head (a normal CIP-GMR head) provided an output of 1.3 mV/μm. As described above, the magnetic heads using the GMR film of the working example provided larger outputs compared with the conventional head. When this magnetic head is used in an HDD having the configuration illustrated in FIG. 13, an areal recording density of not less than 100 Gbit/in$^2$ can be achieved.

Example 15

Using the TMR films of the working examples a06, b04 and the conventional examples a01, b01 in Examples 1 and 2, a yoke-type magnetoresistive magnetic head illustrated in FIG. 12 was produced. A $Ni_{0.8}Fe_{0.2}$ plated alloy was used for the upper and lower shields 41a, 41b. In this example, the TMR film was formed in reverse order to the above examples after Ni—Fe of the lower shield was subjected to CMP polishing. Specifically, the film was formed from the Co—Fe film (for the samples a06, a01) and the Ni—Fe film (for the samples b04, b01), and finally the Pt—Mn film was deposited, on which the electrode film (Au) was formed. The element size of a reproducing head portion was 0.3 μm×0.3 μm. A direct current was supplied as a sense current to the heads thus produced, and outputs of the heads were evaluated by applying an alternating-current signal magnetic field of about 50 Oe. Table 14 shows the result, comparing the outputs of the heads of the working examples a06, b04 with those of the conventional examples a01, b01, respectively.

TABLE 14

| Sample No. | Output |
| --- | --- |
| (Conventional example) a01 | 1.0 |
| a06 | 2.2 |
| (Conventional example) b01 | 1.0 |
| b04 | 1.9 |

As shown in Table 14, the magnetic heads using the TMR film of the working example provided larger outputs compared with the conventional head.

Example 16

An integrated memory was formed on a CMOS substrate with memory devices having a basic configuration as shown in FIG. 15. The device array consisted of eight blocks, each including 16×16 memory devices. Here, the TMR elements of the working example a07 and the conventional example a01 in Example 1 were used as the memory devices. The cross-section area of the element of each sample was 0.2 μm×0.3 μm. One device of each block was used as a dummy device for canceling wiring resistance, the minimum resistance of the devices, and FET resistance. The word lines, the bit lines, or the like were made of Cu.

In each of the eight devices of the eight blocks, the magnetization of the free layer (in this case, the Co—Fe(3) film) was reversed simultaneously by a synthetic magnetic field from the word line and the bit line, and thus signals of 8 bits were recorded on the devices. Next, the gate of an FET that was produced by CMOS was turned on for each device of the respective blocks, thereby causing a sense current to flow. At this time, a comparator compared a voltage generated at the bit lines, the devices, and the FETs in each block with a dummy voltage, and eight-bit information was read simultaneously from the output voltage of each device. The output of the magnetic memory using the TMR elements of the working example was about twice as high as that of the magnetic memory using the TMR elements of the comparative example.

In the following examples 17 to 19, the thermal stability of an MR element including a ferromagnetic material M-X was examined in more detail.

Example 17

Si substrate with a thermal oxide film/Ta (3)/Cu(50)/Ta (3)/Ni—Fe—Cr(4)/Pt—Mn(20)/Co—Fe(3)/Ru(0.9)/Co—Fe(1)/ferromagnetic material M-X(2)/Al—O(1.0)/ferromagnetic material M-X(2)/Ni—Fe(5)/Ta(15)

The Al—O was prepared in the same manner as Example 1. Each film was micro-processed in mesa fashion in the same manner as Example 1, and Cu(50)/Ta(3) was formed as an upper electrode. Subsequently, the element was heat-treated at 280° C. for 5 hours in a magnetic field of 5 kOe so as to impart unidirectional anisotropy to the Pt—Mn. The element area of a sample was $_1$ μm×1.5 μm.

This MR element is a laminated ferrimagnetic pinned layer spin-valve type TMR element having the configuration in accordance with FIG. 5, and a ferromagnetic material M-X is used for a portion of the pinned layer 1 and a portion of the free layer 3. The free layer 3 includes an Ni—Fe soft magnetic layer. The compositions of the ferromagnetic material M-X are as follows. For comparison, elements including Fe and Fe—Co instead of the ferromagnetic material M-X also were produced.

TABLE 15

| Sample No. | Ferromagnetic material M-X |
|---|---|
| (Conventional example) n01 | $Fe_{100}$ |
| (Conventional example) n02 | $[Fe_{0.25}Co_{0.75}]_{100}$ |
| n03 | $Fe_{82}Pt_{18}$ |
| n04 | $[Fe_{0.10}Co_{0.90}]_{90}Pt_{10}$ |
| n05 | $[Fe_{0.70}Ni_{0.30}]_{85}Pt_{15}$ |
| n06 | $[Fe_{0.80}Ni_{0.20}]_{95}Ir_{5}$ |
| n07 | $[Fe_{0.25}Co_{0.75}]_{75}Pd_{25}$ |
| n08 | $[Fe_{0.50}Co_{0.50}]_{88}Al_{12}$ |
| n09 | $[Fe_{0.90}Ni_{0.10}]_{92}Re_{8}$ |
| n10 | $[Fe_{0.15}Co_{0.85}]_{94}B_{6}$ |
| n11 | $[Fe_{0.20}Ni_{0.80}]_{87}C_{13}$ |

To examine the thermal stability of this spin-valve type TMR element, heat treatment was performed in a vacuum ($1\times10^{-6}$ Torr or less) at a temperature up to 450° C. without applying a magnetic field. The temperature profile was as follows: the temperature was raised from a room temperature to a target temperature for the heat treatment over a period of 2 hours, then maintained at the target temperature for 1.5 hours, and lowered to a room temperature over a period of about 5 hours. After the heat treatment, the MR characteristics of this element were examined in the same manner as Example 1.

Figure 19:
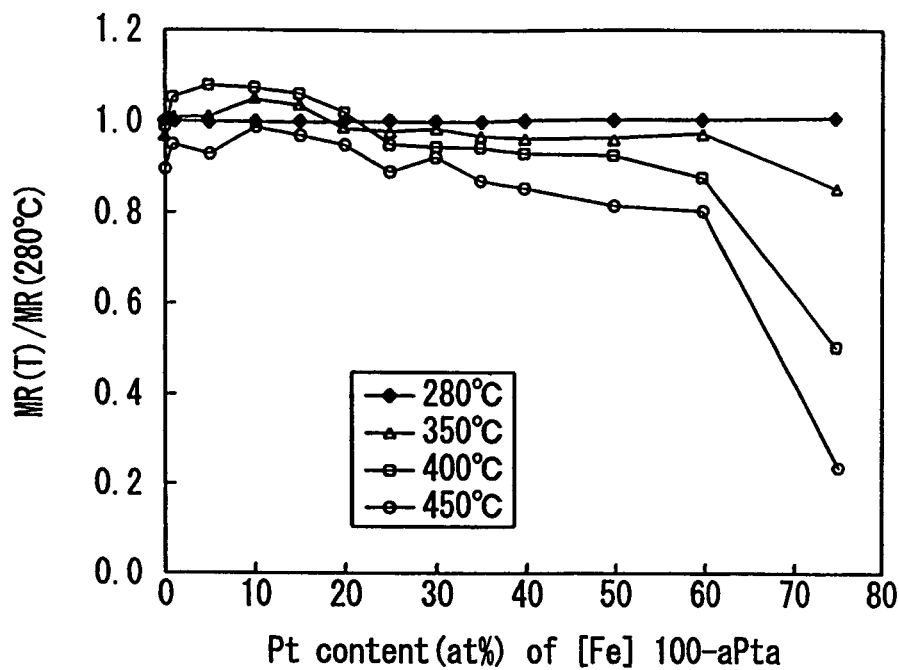
FIG. 19 shows the relationship between a Pt content and a standard MR ratio that were measured in an example.

FIG. 18 shows a standard MR ratio (MR(T)/MR(280° C.)) versus heat treatment temperature. Here, MR(T) is the MR ratio after heat treatment at a temperature of T° C., and MR(280° C.) is the MR ratio after heat treatment that is performed at 280° C. for 5 hours in a magnetic field of 5 kOe so as to impart unidirectional anisotropy to the Pt—Mn. FIG. 19 shows a standard MR ratio versus Pt content in the element (n03) that used Fe—Pt as the ferromagnetic material M-X. In FIG. 19, a minimum amount of Pt added is 0.05 at %.

As shown in FIG. 18, the MR ratio reduced sharply with an increase in heat treatment temperature in the conventional examples. However, excellent thermal stability was achieved in the working examples. FIG. 19 shows that thermal stability decreased rapidly when the Pt content was more than 60%. As shown in FIG. 19, the addition of Pt, even in trace amounts, improves the stability particularly for heat treatment at high temperatures. However, it is preferable that the Pt content ($X^1$) is not less than 0.05%, more preferably not less than 1%, most preferably not less than 5%. When the Pt content is in the range of 1 to 60 at %, a reduction in MR ratio after heat treatment at a temperature up to 450° C. is suppressed to 20% or less.

Example 18

Si substrate with a thermal oxide film/Ta(3)/Cu(50)/Ta(3)/Pt—Mn(20)/pinned layer/Al—N—O(1.0)/Ni—Fe(5)/Ta(15)

The Al—N—O was prepared by forming an Al film having a thickness of 1.0 nm and applying ICP oxynitridation to the Al film in an atmosphere containing oxygen and nitrogen. After the formation of the above films, the element was heat-treated at 260° C. for 5 hours in a magnetic field of 5 kOe so as to impart unidirectional anisotropy to the Pt—Mn. Moreover, each film was micro-processed in mesa fashion in the same manner as Example 1, and Cu(50)/Ta(3) was formed as an upper electrode. The element area of a sample was 0.5 μm×0.2 μm.

This MR element is a laminated ferrimagnetic pinned layer spin-valve type TMR element having the configuration in accordance with FIG. 2. As shown in Table 16, a laminated ferrimagnetic pinned layer of ferromagnetic material M-X/non-magnetic layer/ferromagnetic material M-X, a single pinned layer, or a two-layered pinned layer is used as the pinned layer 1.

TABLE 16

| Sample No. | Pinned layer |
|---|---|
| (Conventional example) p01 | $[Fe_{0.70}Co_{0.30}]_{100}(3)/Ru(0.8)/[Fe_{0.70}Co_{0.30}]_{100}(3)$ |
| p02 | $[Fe_{0.30}Co_{0.70}]_{75}Pt_{25}(3)/Ru(0.8)[Fe_{0.70}Co_{0.30}]_{75}Pt_{25}(3)$ |
| p03 | $[Fe_{0.70}Co_{0.30}]_{65}Pt_{35}(3)/Ru(0.8)/[Fe_{0.70}Co_{0.30}]_{100}(3)$ |
| p04 | $[Co]_{90}Pd_{10}(2.5)/Ru(0.7)/[Co]_{70}Pd_{30}(3)$ |
| p05 | $[Fe]_{90}Pt_{10}(2.5)/Cr(0.9)/[Fe]_{90}Pt_{10}(3)$ |
| p06 | $[Fe]_{70}Ir_{30}(2)/Co(1)/Ru(0.8)/Co(1)/[Fe]_{70}Ir_{30}(2)$ |
| (Conventional example) p07 | $[Fe_{0.70}Ni_{0.30}]_{100}(5)$ |
| p08 | $[Fe_{0.70}Ni_{0.30}]_{90}Cr_{10}(5)$ |
| P09 | $[Fe_{0.70}Ni_{0.30}]_{90}Cr_{10}(2)/[Fe_{0.70}Ni_{0.30}]_{95}Mn_{5}(3)$ |
| p10 | $[Co]_{90}Pt_{10}(4)$ |
| p11 | $[Ni]_{92}Rh_{8}(3)$ |
| p12 | $[Fe]_{70}Pt_{30}(5)$ |
| p13 | $[Fe_{25}Co_{75}]_{100}(1)/[Fe]_{85}Pd_{15}(5)$ |
| p14 | $[Fe_{0.70}Ni_{0.30}]_{86}Ru_{14}(2)/[Fe_{0.70}Ni_{0.30}]_{100}(3)$ |

The substrate is on the left.
The figures in parentheses denote the film thickness in nm.

Figure 20:
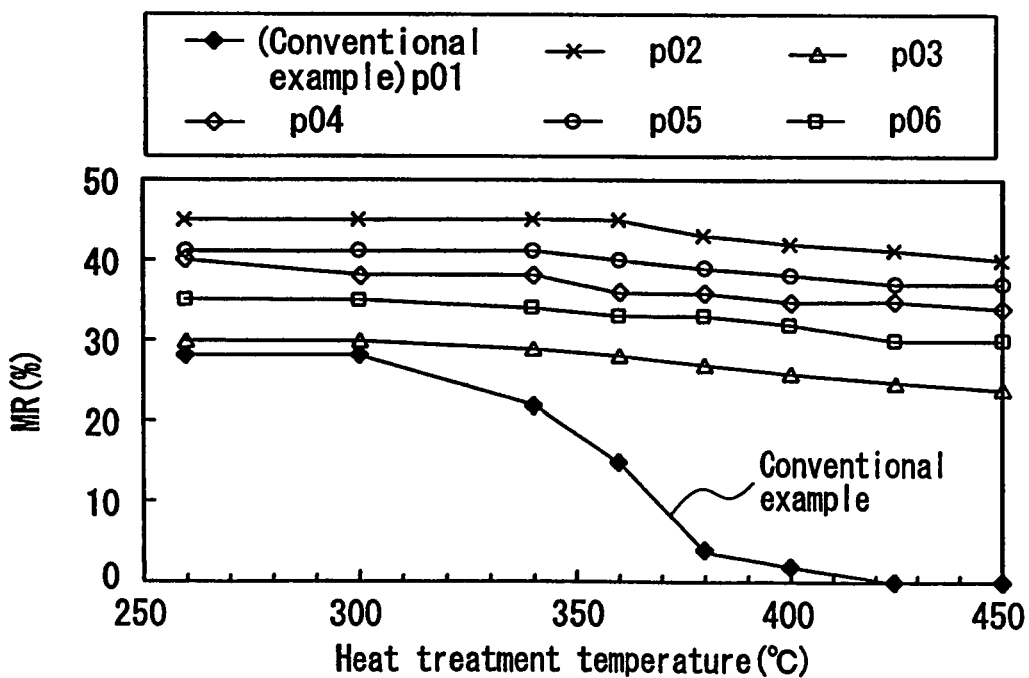
FIG. 20 shows the relationship between a heat treatment temperature and a MR ratio that were measured in an example.
Figure 21:
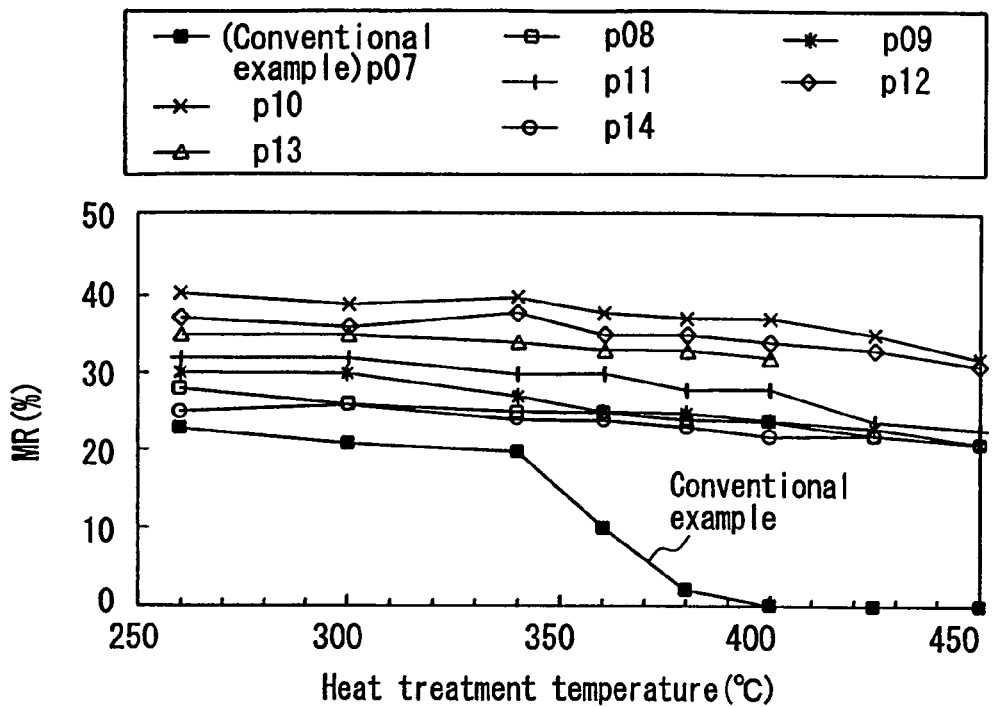
FIG. 21 shows the relationship between a heat treatment temperature and a MR ratio that were measured in another example.

Subsequently, the element thus produced was heat-treated in a magnetic field at a temperature up to 450° C. Then, the MR characteristics 10 were examined in the same manner as Example 1. FIGS. 20 and 21 show the result.

As shown in FIG. 20, the thermal stability of the element was improved by using the ferromagnetic material M-X for at least one of a pair of magnetic films that constitute the laminated ferrimagnetic pinned layer. In particular, the thermal stability was improved significantly when the ferromagnetic material was used for at least the magnetic film on the side of the tunnel insulating layer (p02, p04 to p06). Moreover, excellent thermal stability also was achieved by the element p06, in which the antiferromagnetic exchange coupling of the magnetic layers separated by Ru was strengthened by providing Co alloy (interface magnetic layers) at the interfaces of the non-magnetic layer (Ru) of the laminated ferrimagnetic pinned layer.

As shown in FIG. 21, the thermal stability was improved also when a two-layered magnetic layer was used as the pinned layer, and the ferromagnetic material M-X was used for one of the two layers.

Example 19

Si substrate with a thermal oxide film/Ta(3)/Cu(50)/Ta(3)/free layer/Al—O(0.8)/Co—Fe(2.5)/Ru(0.8)/Co—Fe(2.5)/Pt—Mn(15)/Ta(15)

The Al—O was prepared in the same manner as Example 1. After the formation of the above films, the element was heat-treated at 280° C. for 3 hours in a magnetic field of 5 kOe so as to impart unidirectional anisotropy to the Pt—Mn. Moreover, each film was micro-processed in mesa fashion in the same manner as Example 1, and Cu(50)/Ta(3) was formed as an upper electrode. The element area of a sample was 0.1 μm×0.2 μm. Here, single- or multi-layer films represented by q01 to q08 in Table 17 were used as the free layer. The magnetoresistance of this element was measured at room temperature, and the coercive force (Hc) of the free layer at that time was examined. Table 17 shows the results together.

TABLE 17

| Sample No. | Free layer | Hc(Oe) |
| --- | --- | --- |
| (Conventional example) q01 | $[Fe_{0.20}Ni_{0.80}]_{100}(3)$ | 98 |
| q02 | $[Fe_{0.20}Ni_{0.80}]_{85}Pt_{15}(3)$ | 60 |
| q03 | $[Fe_{0.20}Ni_{0.80}]_{100}(2)/[Fe_{0.20}Ni_{0.80}]_{85}Pt_{15}(1)$ | 62 |
| q04 | $[Fe_{0.20}Ni_{0.80}]_{85}Pt_{15}(1)/[Fe_{0.20}Ni_{0.80}]_{100}(2)$ | 63 |
| (Conventional example) q05 | $[Fe_{0.20}Ni_{0.80}]_{100}(2)/Ru(0.8)/[Fe_{0.20}Ni_{0.80}]_{100}(3)$ | 74 |
| q06 | $[Fe_{0.20}Ni_{0.80}]_{100}(2)/Ru(0.8)/[Fe_{0.20}Ni_{0.80}]_{75}Pt_{25}(3)$ | 51 |
| q07 | $[Fe_{0.20}Ni_{0.80}]_{75}Pt_{25}(2)/Ru(0.8)/[Fe_{0.20}Ni_{0.80}]_{75}Pt_{25}(3)$ | 50 |
| q08 | $[Fe_{0.20}Ni_{0.80}]_{75}Pt_{25}(2)/Ru(0.8)/[Fe_{0.20}Ni_{0.80}]_{100}(3)$ | 48 |

The substrate is on the left.
The figures in parentheses denote the film thickness in nm.

Figure 22:
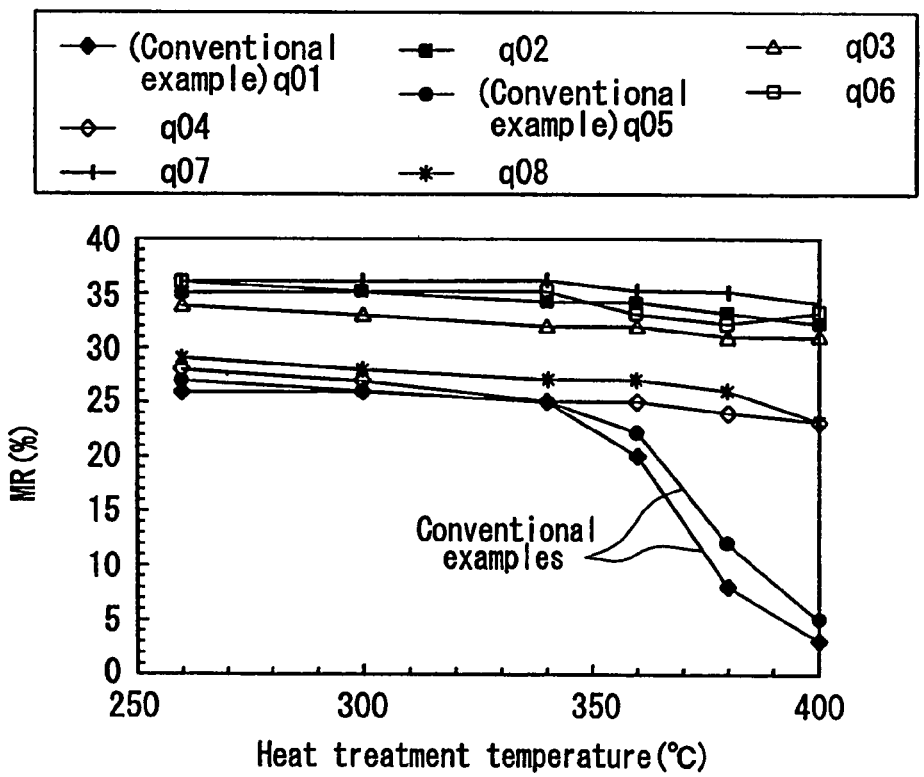
FIG. 22 shows the relationship between a heat treatment temperature and a MR ratio that were measured in yet another example.

Subsequently, the element thus produced was heat-treated in a magnetic field at a temperature up to 400° C. Then, the MR characteristics were examined in the same manner as Example 1. FIG. 22 shows the result.

As described above, the elements that used the ferromagnetic material M-X (FeNiPt) for the free layer achieved a considerable improvement in the soft magnetic characteristics of the free layer and the MR ratio.

Example 20

The following sample was formed on a Si substrate provided with a thermal oxide film by multi-target magnetron sputtering, and the MR characteristics and the thermal stability were examined.

Si substrate with a thermal oxide film/Ta(3)/Cu(50)/Ta(3)/free layer(4)/Al—O(0.8)/pinned layer/Ir—Mn(20)/Ta(15)

Figure 23:
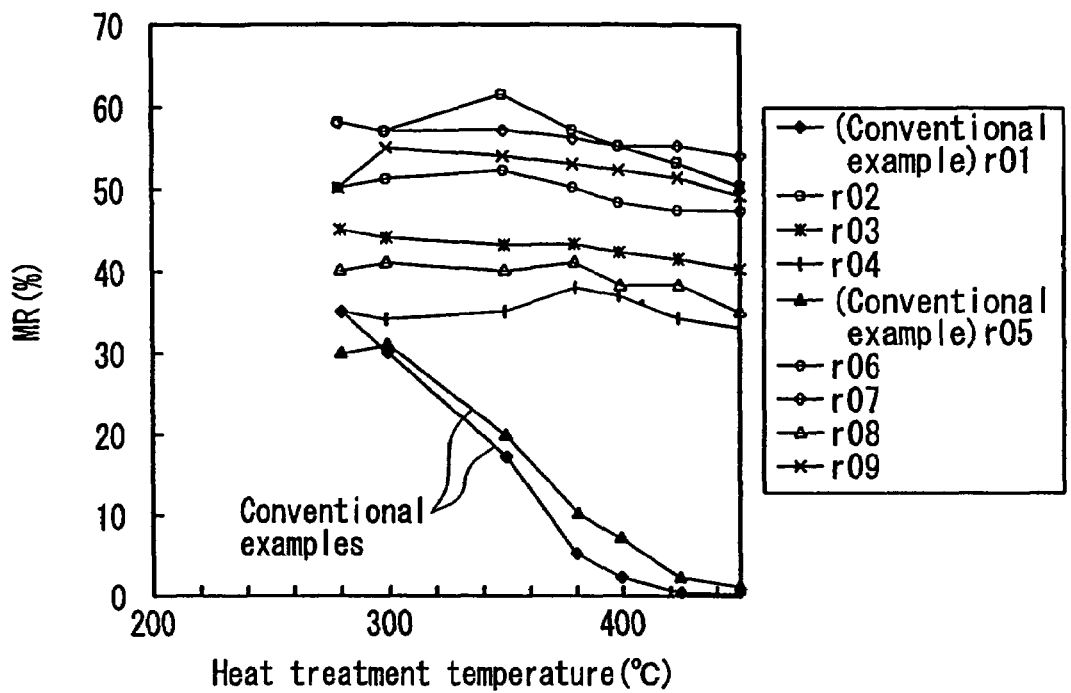
FIG. 23 shows the relationship between a heat treatment temperature and a MR ratio that were measured in yet another example.

The Al—O was prepared in the same manner as Example 1. Each film was micro-processed in mesa fashion in the same manner as Example 1, and Cu(50)/Ta(3) was formed as an upper electrode. Subsequently, the element was heat-treated at 280° C. for 5 hours in a magnetic field of 5 kOe so as to impart unidirectional anisotropy to the Ir—Mn. The element area of the sample was 0.5 μm×1 μm. This MR element has the configuration of a TMR element in accordance with FIG. 2. Here, MR elements for different pinned layers, each including a ferromagnetic material M-X, were produced and thermal stability was examined. In Table 18, $Fe_{0.8}Ni_{0.2}$ was used for the free layers of r01 and r05 and $[Fe_{0.8}Ni_{0.2}]_{70}Pt_{30}$ was used for the free layers of the other samples. To examine the thermal stability, the elements were heat-treated in a vacuum while applying a magnetic field of 5 kOe, which then were maintained at their respective target temperatures for 5 hours. Thereafter, the magnetoresistance was measured at room temperature. FIG. 23 shows the dependence of the MR ratio on heat treatment temperature.

TABLE 18

| Sample No. | Pinned layer |
| --- | --- |
| (Conventional example) r01 | $[Fe_{0.25}Co_{0.75}]_{100}(4)$ |
| r02 | $[Fe_{0.50}Co_{0.50}]_{95}Pt_5(4)$ |
| r03 | $Co(1)/[Fe_{0.70}Ni_{0.30}]_{85}Pt_{15}(1.5)/Co(2)$ |
| r04 | $Co(2)/[Fe]_{75}Pt_{25}(2)$ |
| (Conventional example) r05 | $Co(3)/Ru(0.8)/Co(3)$ |
| r06 | $[Fe]_{85}Pt_{15}(2.5)/Co(1)/Ru(0.8)/Co(3)$ |
| r07 | $[Fe_{0.7}Co_{0.3}]_{90}Pt_{10}(2)/Co(0.5)/Ru(0.8)/Co(2.5)$ |

TABLE 18-continued

| Sample No. | Pinned layer |
| --- | --- |
| r08 | $[Fe_{0.8}Ni_{0.2}]_{85}Pt_{10}Pd_5(2)/Co(1)/Ru(0.8)/Co(4)$ |
| r09 | $[Fe_{0.75}Ni_{0.25}]_{80}Pt_{20}(2)/Co(1)/Ru(0.8)/Co(4)$ |

The substrate is on the left.
The figures in parentheses denote the film thickness in nm.

Example 21

The following sample was formed on a Si substrate provided with a thermal oxide film by multi-target magnetron sputtering, and the MR characteristics and the thermal stability were examined.

Si substrate with a thermal oxide film/Ta(3)/Cu(50)/Ta(3)/Cr(4)/laminated ferrimagnetic pinned layer/Al—N(1.0)/Co—Fe(1)/Ni—Fe(3)/Ta(15)

Figure 24:
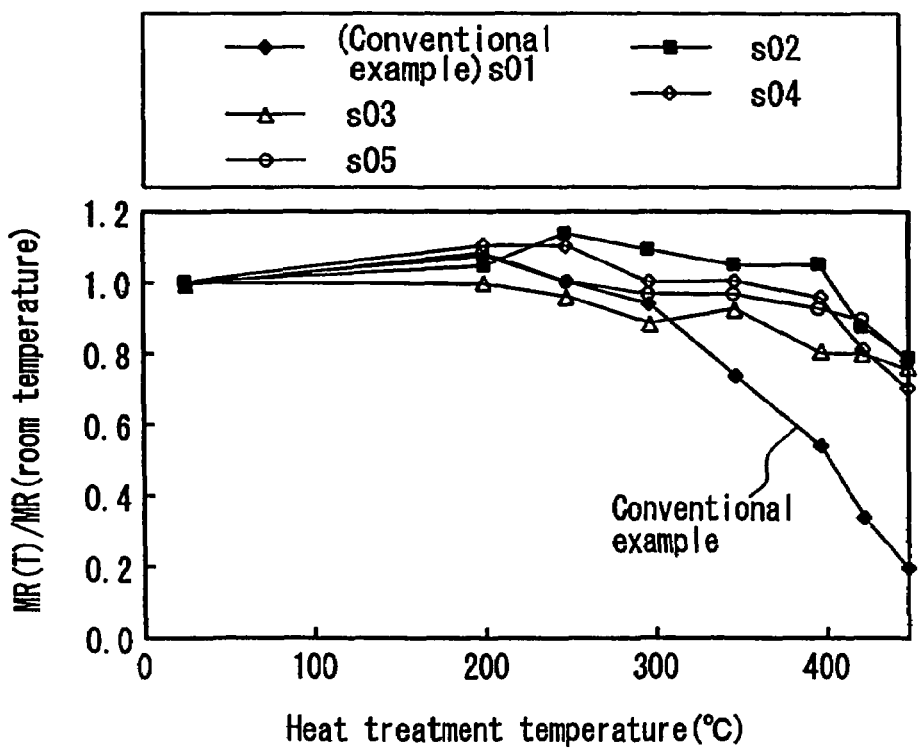
FIG. 24 shows the relationship between a heat treatment temperature and a MR ratio that were measured in yet another example.

Here, the thickness (1.0) of Al—N represents a total of designed thicknesses of Al before nitridation. The Al—N was prepared with ICP nitridation. Each film was micro-processed in mesa fashion in the same manner as Example 1, and Cu(50)/Ta(3) was formed as an upper electrode. The element area of the sample was 2 μm×4 μm. For this MR element, the pinned layer was a laminated ferrimagnetic material shown in Table 19, and the free layer was a two-layer film of Co—Fe/Ni—Fe. The MR element was heat-treated at temperatures from a room temperature to 450° C. without applying a magnetic field, and then the thermal stability for an MR ratio was examined. The magnetoresistance measurements were made at room temperature while applying a maximum magnetic field of 500 Oe after each heat treatment. FIG. 24 shows the heat treatment temperature dependence of the MR ratio after heat treatment with respect to the MR ratio before the heat treatment.

TABLE 19

| Sample No. | Laminated ferrimagnetic pinned layer |
|---|---|
| (Conventional example) s01 | Co(3)/Ru(0.8)/Co(3) |
| s02 | [Co]$_{90}$Pt$_{10}$(3)/Ru(0.8)/[Co]$_{90}$Pt$_{10}$(3) |
| s03 | [Fe]$_{70}$Pt$_{30}$(2.5)/Cr(0.9)/[Fe]$_{70}$Pt$_{30}$(3) |
| s04 | Co(3)/Ru(0.8)/Co(2.5)/[Fe]$_{85}$V$_{15}$(0.5) |
| s05 | [Fe]$_{50}$Pt$_{50}$(1)/Co(2)/Ru(0.8)/Co(2)/[Fe]$_{90}$Pt$_{10}$(1) |

The substrate is on the left.
The figures in parentheses denote the film thickness in nm.

Example 22

The following sample was formed on a Si substrate provided with a thermal oxide film by multi-target magnetron sputtering, and the MR characteristics and the thermal stability were examined.

Si substrate with a thermal oxide film/Ta(3)/Cu(50)/Ta(3)/Ni—Fe—Co(4)/Pt—Mn(15)/Co—Fe(2)/pinned layer 1/Al—O(1.0)/free layer/Al—O(1.0)/pinned layer 2/Co—Fe(2)/Pt—Mn(15)/Ta(15)

The method for forming the Al—O was the same as that in Example 1. After the formation of the above films, the element was heat-treated at 280° C. for 3 hours in a magnetic field of 5 kOe so as to impart unidirectional anisotropy to the Pt—Mn. Moreover, each film was processed in mesa fashion in the same manner as Example 1, and Ta(5)/Pt(10)/Cu(50)/Ta(3) was formed as an upper electrode. The element area of the sample was 0.5 μm×0.3 μm.

This element is a dual spin-valve type TMR element as shown in FIG. 6. Table 20 shows the magnetic films used for the pinned layers 1, 2 and the free layer in the film structure described above.

TABLE 20

| Sample No. | Pinned layers 1, 2 | Free layer | Output (mV) |
|---|---|---|---|
| (Conventional example) t01 | Fe$_{0.3}$Co$_{0.7}$(2) | Fe$_{0.4}$Ni$_{0.6}$(3) | 70 |
| t02 | [Fe$_{0.20}$Ni$_{0.80}$]$_{85}$Pt$_{15}$(2) | [Fe$_{0.20}$Ni$_{0.80}$]$_{75}$Pt$_{25}$(3) | 270 |
| t03 | [Fe$_{0.50}$Co$_{0.50}$]$_{90}$Pt$_{10}$(2) | [Fe$_{0.40}$Ni$_{0.60}$]$_{65}$Pt$_{35}$(3) | 234 |

The outputs were obtained when a bias voltage of 1 V was applied to each element after heat treatment at 400° C.

Figure 25:
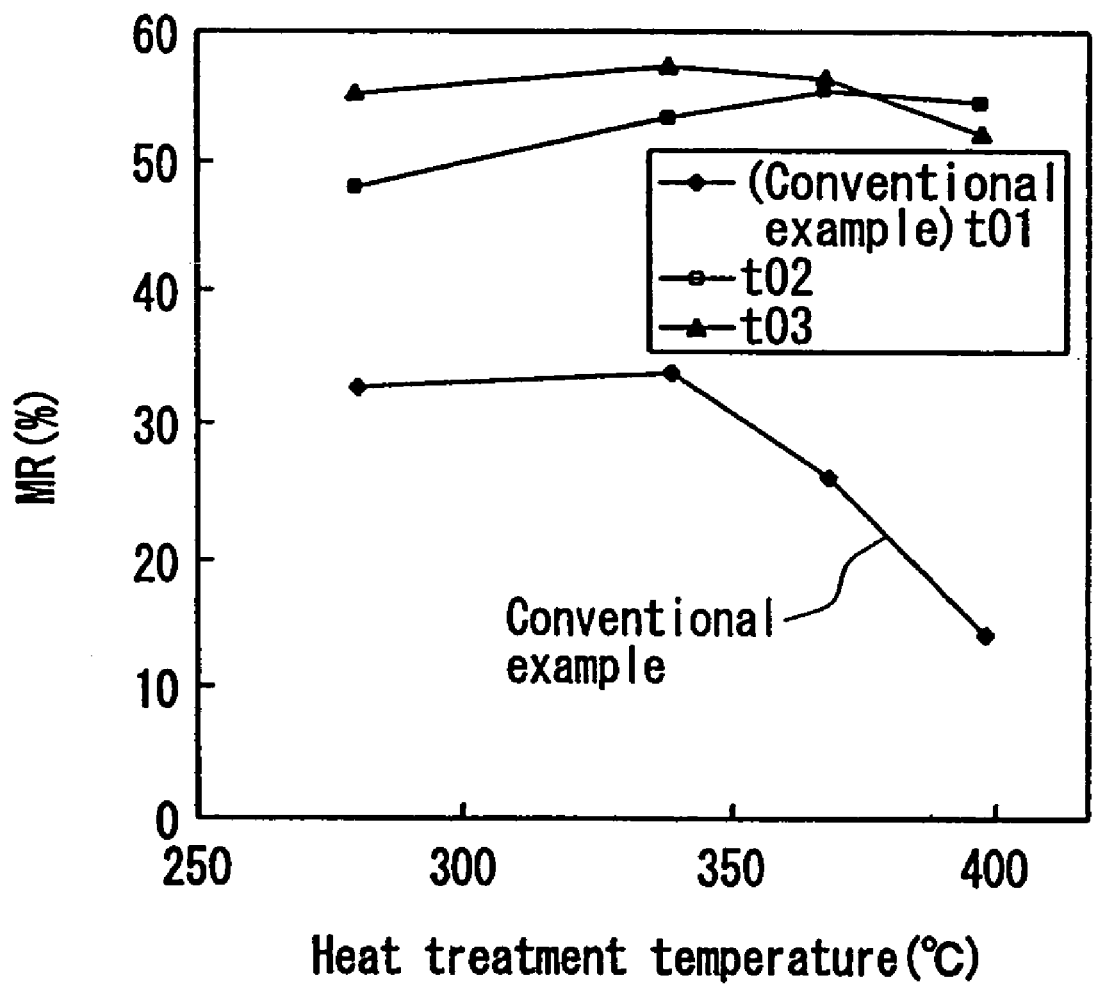
FIG. 25 shows the relationship between a heat treatment temperature and a MR ratio that were measured in yet another example.

After the mesa-type TMR element was produced, heat treatment was performed at each of temperatures ranging from 280° C. to 400° C. for 1 hour in a magnetic field of 5 kOe, followed by measurement of the magnetoresistance and the I-V characteristics at room temperature. FIG. 25 shows an MR ratio at each heat treatment temperature. Table 20 shows the outputs obtained when a bias voltage of 1V was applied to the element after heat treatment at 400° C. As shown in FIG. 25, the MR characteristics stability can be improved when the ferromagnetic material M-X is used, even in the dual spin-valve type TMR element. Moreover, it is also possible to provide the element that is capable of maintaining a high output even after heat treatment at 400° C.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The present invention can provide an MR element having a larger MR ratio and excellent thermal stability compared with a conventional element. The MR element of the present invention also can improve the characteristics of magnetic devices, such as a magnetoresistive magnetic head, a magnetic recording apparatus including the magnetoresistive magnetic head, and a high-density magnetic memory (MRAM).

The invention claimed is:

1. A magnetoresistive memory device, comprising:
a multi-layer film comprising at least two magnetic layers and at least one non-magnetic layer made of an insulating material interposed between the two magnetic layers,
wherein a resistance value changes with a relative angle formed by magnetization directions of the at least two magnetic layers, and
at least one of the magnetic layers is a laminated layer including a first layer of the ferromagnetic material consisting of $M_{100-a}X_a$, a metal layer, and a second layer of the ferromagnetic material consisting of $M_{100-a}X_a$, which are stacked in this order,
where M is at least one element selected from the group consisting of Fe, Co and Ni, X is one element selected from the group consisting of Pt, Pd and Ir, and a satisfies the following equation, $0.05 \leq a \leq 60$, and wherein a ratio MR(T)/MR(280) is 0.8 or more,
where the MR(T) is defined as the MR ratio after heat treatment at a temperature of T° C. and the MR(280) is defined as the MR ratio after heat treatment at 280° C.

2. The magnetoresistive memory device according to claim 1, wherein a satisfies the following equation:

$5 \leq a \leq 60$.

3. The magnetoresistive memory device according to claim 1, wherein X is Pt.

4. The magnetoresistive memory device according to claim 1, wherein X is Pd.

5. The magnetoresistive memory device according to claim 1, wherein X is Ir.

6. The magnetoresistive memory device according to claim 1, wherein X is Pt and a satisfies the following equation:

$5 \leq a \leq 60$.

7. The magnetoresistive memory device according to claim 1, wherein X is Pd and a satisfies the following equation:

$5 \leq a \leq 60$.

8. The magnetoresistive memory device according to claim 1, wherein X is Ir and a satisfies the following equation:

$5 \leq a \leq 60$.

9. The magnetoresistive memory device according to claim 1, wherein the metal is Ru or Cr.

10. A magnetoresistive memory device, comprising:
a multi-layer film comprising at least two magnetic layers and at least one non-magnetic layer made of an insulating material interposed between the two magnetic layers,
wherein a resistance value changes with a relative angle formed by magnetization directions of the at least two magnetic layers, and
at least one of the magnetic layers is a free magnetic layer and includes a ferromagnetic material consisting of $M_{100-a}X_a$,
where M is at least one element selected from the group consisting of Fe, Co and Ni, X is one element selected from the group consisting of Pt, Pd and Ir, and a satisfies the following equation, $0.05 \leq a \leq 60$, and wherein a ratio MR(T)/MR(280) is 0.8 or more,
where the MR(T) is defined as the MR ratio after heat treatment at a temperature of T° C. and the MR(280) is defined as the MR ratio after heat treatment at 280° C.

11. A The magnetoresistive memory device, comprising:
a multi-layer film comprising at least two magnetic layers and at least one non-magnetic layer made of an insulating material interposed between the two magnetic layers,
wherein a resistance value changes with a relative angle formed by magnetization directions of the at least two magnetic layers, and
all of the magnetic layers include the ferromagnetic material consisting of $M_{100-a}X_a$
where M is at least one element selected from the group consisting of Fe, Co and Ni, X is one element selected from the group consisting of Pt, Pd and Ir, and a satisfies the following equation, $0.05 \leq a \leq 60$, and wherein a ratio MR(T)/MR(280) is 0.8 or more,
where the MR(T) is defined as the MR ratio after heat treatment at a temperature of T° C., and the MR(280) is defined as the MR ratio after heat treatment at 280° C.

\* \* \* \* \*

UNITED STATES PATENT AND TRADEMARK OFFICE
CERTIFICATE OF CORRECTION

| | | |
|---|---|---|
| PATENT NO. | : 7,079,361 B2 | Page 1 of 1 |
| APPLICATION NO. | : 11/060028 | |
| DATED | : July 18, 2006 | |
| INVENTOR(S) | : Sugita et al. | |

It is certified that error appears in the above-identified patent and that said Letters Patent is hereby corrected as shown below:

Title Page, Item (56)
Page 2, second column, other publications, line 3: "(III)" should read --(111)--
Page 2, second column, other publications, lines 6-7: "MRAM Technology Progress and
    Prospect Materials"
    should read --"MRAM Technology Progress and Prospect," Materials--
Page 2, second column, other publications, line 13: "A1on" should read --AION--
Column 34, line 48(claim 1): "T°C." should read --T°C,--
Column 36, line 2(claim 10): "T°C." should read --T°C,--
Column 36, line 4(claim 11): "A The magnetoresistive" should read
    --A magnetoresistive--
Column 36, line 22(claim 11): "T°C.," should read --T°C,--

Signed and Sealed this

Sixth Day of March, 2007

JON W. DUDAS
*Director of the United States Patent and Trademark Office*